US009729215B2

(12) United States Patent
Rahman et al.

(10) Patent No.: US 9,729,215 B2
(45) Date of Patent: Aug. 8, 2017

(54) OFDM SIGNAL COMPRESSION

(71) Applicant: Samsung Electronics Co., Ltd., Suwon-si, Gyeonggi-do (KR)

(72) Inventors: Md. Saifur Rahman, Richardson, TX (US); Boon Loong Ng, Plano, TX (US); Gang Gary Xu, Allen, TX (US); Jianzhong Zhang, Plano, TX (US); Hongbo Si, Garland, TX (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 94 days.

(21) Appl. No.: 14/745,104

(22) Filed: Jun. 19, 2015

(65) Prior Publication Data

US 2015/0372728 A1    Dec. 24, 2015

Related U.S. Application Data

(60) Provisional application No. 62/015,884, filed on Jun. 23, 2014, provisional application No. 62/094,780, filed on Dec. 19, 2014.

(51) Int. Cl.
*H04W 4/00* (2009.01)
*H04B 7/0456* (2017.01)
(Continued)

(52) U.S. Cl.
CPC ........ *H04B 7/0456* (2013.01); *H03M 7/3082* (2013.01); *H04L 5/0007* (2013.01);
(Continued)

(58) Field of Classification Search
None
See application file for complete search history.

(56) References Cited

U.S. PATENT DOCUMENTS 8,749,408 B1    6/2014 Li
9,054,876 B1 *  6/2015 Yagnik ................. H04L 9/3236
                                                706/45
(Continued)

FOREIGN PATENT DOCUMENTS

JP    2007189152 A    7/2007
JP    2009081423 A    4/2009
(Continued)

OTHER PUBLICATIONS

International Search Report dated Oct. 8, 2015 in connection with International Application PCT/KR2015/006384; 3 pages.
(Continued)

*Primary Examiner* — Otis L Thompson, Jr.

(57) ABSTRACT

Methods and apparatuses for fronthaul signal compression and decompression. An apparatus for fronthaul signal compression includes a receiver, signal processing circuitry, and a fronthaul interface. The receiver is configured to receive one or more signals comprising complex samples. The signal processing circuitry is configured to construct vectors representing at least a portion of the complex samples; map the vectors to codeword indices in a vector quantization codebook; and process the codeword indices into an output signal. The fronthaul interface is configured to transmit the output signal via a fronthaul communication link of a wireless network. The vectors may be constructed according to the selected vectorization method. The vector quantization codebook may be selected from a set of vector quantization codebooks generated based on training signals and signaled.

20 Claims, 11 Drawing Sheets

(51) Int. Cl.
*H04L 5/00* (2006.01)
*H04L 27/26* (2006.01)
*H03M 7/30* (2006.01)

(52) U.S. Cl.
CPC ........ *H04L 27/2602* (2013.01); *H04L 5/0053* (2013.01); *H04L 27/2605* (2013.01)

(56) References Cited

U.S. PATENT DOCUMENTS

| | | | |
|---|---|---|---|
| 2003/0012446 A1* | 1/2003 | Thomas | G06T 9/008 382/253 |
| 2004/0185811 A1 | 9/2004 | Woo et al. | |
| 2007/0149135 A1* | 6/2007 | Larsson | H04B 7/022 455/67.13 |
| 2007/0297529 A1* | 12/2007 | Zhou | H04B 7/0417 375/267 |
| 2009/0074076 A1 | 3/2009 | Li et al. | |
| 2009/0252240 A1* | 10/2009 | Kwon | H04B 7/0639 375/260 |
| 2010/0217753 A1 | 8/2010 | Shlomot et al. | |
| 2011/0150114 A1* | 6/2011 | Miao | H04B 7/0417 375/260 |
| 2012/0188899 A1* | 7/2012 | Zhang | H04L 1/0026 370/252 |
| 2012/0294249 A1* | 11/2012 | Yu | H04B 7/024 370/329 |
| 2013/0201912 A1* | 8/2013 | Sheng | H04B 7/0413 370/328 |
| 2014/0104801 A1 | 4/2014 | Saji et al. | |
| 2014/0145883 A1 | 5/2014 | Baks et al. | |
| 2014/0369397 A1* | 12/2014 | Nakamura | H04B 7/0456 375/232 |
| 2015/0170655 A1* | 6/2015 | Li | G10L 21/0388 704/500 |
| 2016/0119045 A1* | 4/2016 | Rahman | H04B 7/0617 375/267 |
| 2016/0278108 A1* | 9/2016 | Tong | H04W 72/12 |

FOREIGN PATENT DOCUMENTS

| | | |
|---|---|---|
| WO | WO 2014/076004 A2 | 5/2014 |
| WO | WO 2014/110730 A1 | 7/2014 |

OTHER PUBLICATIONS

International Written Opinion dated Oct. 8, 2015 in connection with International Application PCT/KR2015/006384; 6 pages.
Samardzija, et al.; "Compressed Transport of Baseband Signals in Radio Access Networks"; IEEE Transactions on Wireless Communications; vol. 11. No. 9; Sep. 2012; pp. 3216-3225.
CPRI Specification V6.1; Common Public Radio Interface (CPRI); Interface Specification; Jul. 1, 2014; 129 pgs.
Gray, et al.; "Quantization"; IEEE Transactions on Information Theory, vol. 44, No. 6; Oct. 1998; 59 pgs.
Altera Wiki; "CPRI Compression"; http://www.alterawiki.com/wiki/CPRI_Compression; 6 pgs.
IDT Integrated Device Technology; Compression IP for Wireless Infrastructure Applications; 2013; 2 pgs.
IDT Integrated Device Technology; "Front-Haul Compression for Emerging C-RAN and Small Cell Networks"; Apr. 29, 2013; 8 pgs.
IDT Integrated Device Technology; "IQ Data Compression IP" http://www.idt.com/products/interface-connectivity/ip-data-compression-ip; 2015; 2 pgs.
Nieman; et al. "Time-Domain Compression of Complex-Baseband LTE Signals for Cloud Radio Access Networks"; Wireless Networking and Communications Group, The University of Texas at Austin; 2013; pp. 1198-1201.
Samardzija, et al.; "Compressed Transport of Baseband Signals in Radio Access Networks"; IEEE Transactions on Wireless Communications, vol. 11, No. 9; Sep. 2012; 10 pgs.
"Samplify Introduces New Compression Technology to Lower Costs for Mobile Operators Migrating to 4G"; http://www.prnewswire.com/news-releases/samplify-introduces-new-compression-technology-to-lower-costs-for-mobile-operators-migrating-to-4g-9208411; 2015; 3 pgs.
International Search Report, dated Sep. 24, 2015, in connection with Application No. PCT/KR2015/006729, 3 pages.
Written Opinion of the International Searching Authority, dated Sep. 24, 2015, in connection with Application No. PCT/KR2015/006729, 5 pages.

* cited by examiner

OFDM SIGNAL COMPRESSION

CROSS-REFERENCE TO RELATED APPLICATION(S) AND CLAIM OF PRIORITY

This application claims priority under 35 U.S.C. §119(e) to U.S. Provisional Patent Application Ser. No. 62/015,884, filed Jun. 23, 2014, entitled "METHODS AND APPARATUS FOR OFDM SIGNAL COMPRESSION". The present application also claims priority to U.S. Provisional Patent Application Ser. No. 62/094,780, filed Dec. 19, 2014, entitled "METHODS AND APPARATUS FOR OFDM SIGNAL COMPRESSION". The above-identified provisional patent applications are hereby incorporated by reference in their entirety.

TECHNICAL FIELD

This disclosure relates generally to wireless communication. More specifically, this disclosure relates to orthogonal frequency division multiplexing (OFDM) signal compression and decompression.

BACKGROUND

There are various ways to deploy or implement a wireless communication network. In a particular implementation or architecture, the wireless communication network can be deployed as a Distributed Antenna System (DAS), where a network of spatially separated antenna notes is connected to a central unit via a transport medium. A related concept or architecture is the Centralized Radio Access Networks (RAN) or Cloud RAN (C-RAN), where spatially separated Remote Radio Units (RRUs) or Remote Radio Heads (RRHs) providing wireless coverage to a large area are connected to a centralized controller or processor. For DAS, C-RAN, or other similar architectures, the links or networks between the central node and the radio nodes are referred to as the fronthaul. The interface on fronthaul can either be proprietary or can be based on an industry standard, known as the Common Publish Radio Interface (CPRI). Specifically, the CPRI standard defines the interface of base stations between the Radio Equipment Controller (REC), Digital Units (DUs), or Baseband Unit (BBU), to local or remote radio units (RUs), such as Radio Equipment (RE), RUs, and/or RRHs.

With the continuing advancement of radio access technology, such as the Long Term Evolution (LTE) and LTE-Advanced, the requirement on the CPRI data rate also increases significantly. For example, CPRI data rate between a BBU and a RRU for a 3-sector 20 mega-Hertz (MHz) LTE system with 2×2 multiple-input multiple-output (MIMO) may require about 6 giga-bits per second (Gbps). However, an LTE system capable of 8×8 MIMO and carrier aggregation may require one or several order of magnitudes increase in the CPRI data rate (e.g., 60 Gbps). One way to address the increase in the CPRI data rate is to deploy more links (typically fibers) connecting the BBUs and the RRHs, but such deployment can be costly.

SUMMARY

Embodiments of the present disclosure provide OFDM signal compression and decompression.

In one embodiment, an apparatus for fronthaul signal compression includes a receiver, signal processing circuitry, and a fronthaul interface. The receiver is configured to receive one or more signals comprising complex samples. The signal processing circuitry is configured to construct vectors representing at least a portion of the complex samples; map the vectors to codeword indices in a vector quantization codebook; and process the codeword indices into an output signal. The fronthaul interface is configured to transmit the output signal via a fronthaul communication link of a wireless network.

In another embodiment, a method for fronthaul signal compression is provided. The method includes receiving one or more signals comprising complex samples. The method also includes constructing vectors representing at least a portion of the complex samples and mapping the vectors to codeword indices in a vector quantization codebook. Additionally, the method includes processing the codeword indices into an output signal and transmitting the output signal via a fronthaul communication link of a wireless network.

In yet another embodiment, an apparatus for fronthaul signal decompression is provided. The apparatus includes a fronthaul interface and signal processing circuitry. The fronthaul interface is configured to receive an input signal via a fronthaul communication link of a wireless network. The signal processing circuitry is configured to process the input signal to identify codeword indices, map the codeword indices to vectors in a vector quantization codebook, and devectorize the vectors into complex samples of an orthogonal frequency division multiplexing (OFDM) signal.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 19, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
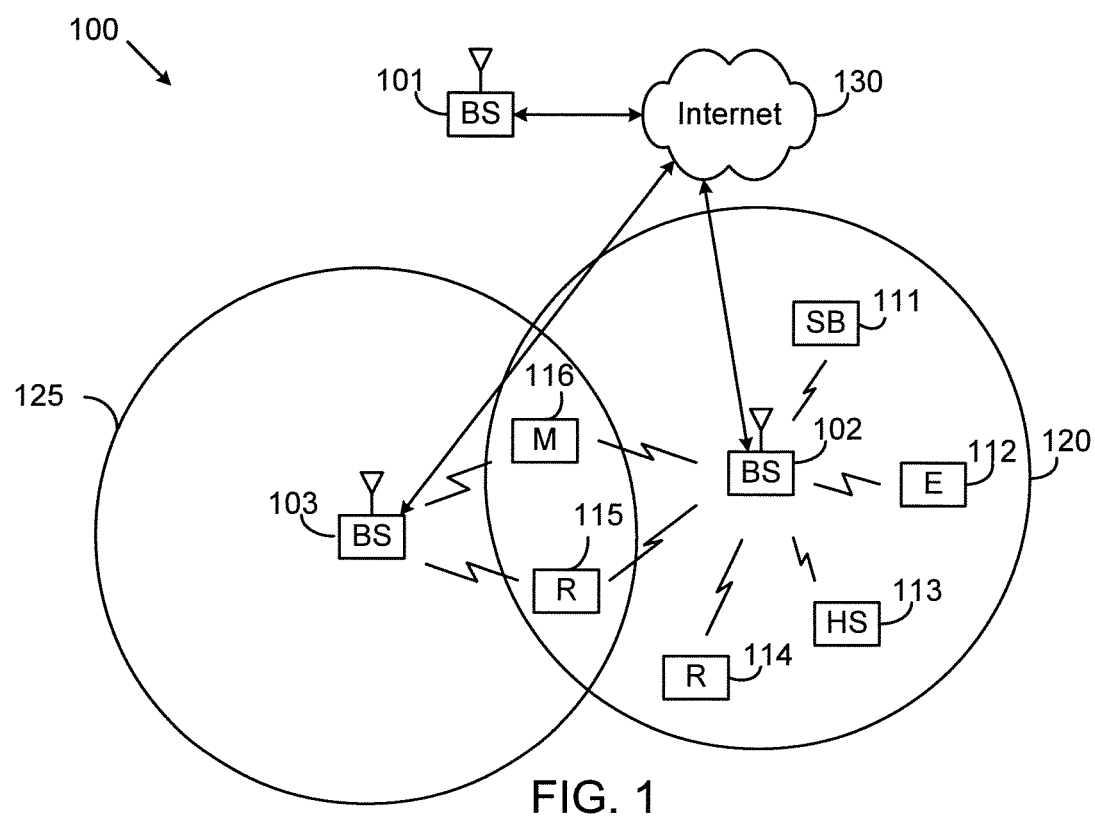
FIG. 1 illustrates an example wireless network according to illustrative embodiments of this disclosure.
Figure 2:
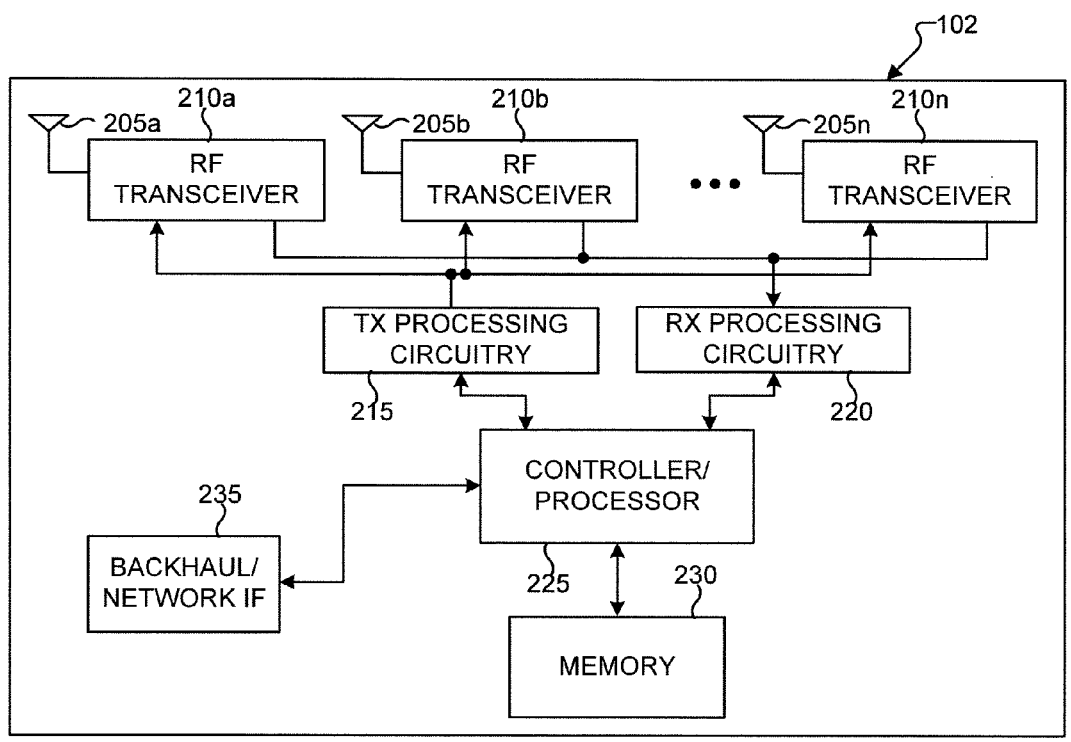
FIG. 2 illustrates an example eNodeB (eNB) according to this disclosure.

FIGS. 1 and 2 below describe various embodiments implemented in wireless communications systems and with the use of OFDM or OFDMA communication techniques. The description of FIGS. 1 and 2 is not meant to imply physical or architectural limitations to the manner in which different embodiments may be implemented. Different embodiments of the present disclosure may be implemented in any suitably-arranged communications system.

FIG. 1 illustrates an example wireless network 100 according to this disclosure. The embodiment of the wireless network 100 shown in FIG. 1 is for illustration only. Other embodiments of the wireless network 100 could be used without departing from the scope of this disclosure.

As illustrated in FIG. 1, the wireless network 100 includes an eNodeB (eNB) 101, an eNB 102, and an eNB 103. The eNB 101 communicates with the eNB 102 and the eNB 103. The eNB 101 also communicates with at least one network 130, such as the Internet, a proprietary Internet Protocol (IP) network, or other data network.

The eNB 102 provides wireless broadband access to the network 130 for a first plurality of user equipments (UEs) within a coverage area 120 of the eNB 102. The first plurality of UEs includes a UE 111, which may be located in a small business (SB); a UE 112, which may be located in an enterprise (E); a UE 113, which may be located in a WiFi hotspot (HS); a UE 114, which may be located in a first residence (R); a UE 115, which may be located in a second residence (R); and a UE 116, which may be a mobile device (M), like a cell phone, a wireless laptop, a wireless PDA, or the like. The eNB 103 provides wireless broadband access to the network 130 for a second plurality of UEs within a coverage area 125 of the eNB 103. The second plurality of UEs includes the UE 115 and the UE 116. In some embodiments, one or more of the eNBs 101-103 may communicate with each other and with the UEs 111-116 using 5G, LTE, LTE-A, WiMAX, WiFi, or other wireless communication techniques.

Depending on the network type, other well-known terms may be used instead of "eNodeB" or "eNB," such as "base station" or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station," "subscriber station," "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

Dotted lines show the approximate extents of the coverage areas 120 and 125, which are shown as approximately circular for the purposes of illustration and explanation only. It should be clearly understood that the coverage areas associated with eNBs, such as the coverage areas 120 and 125, may have other shapes, including irregular shapes, depending upon the configuration of the eNBs and variations in the radio environment associated with natural and man-made obstructions.

As described in more detail below, one or more of the eNBs may include circuitry for OFDM signal compression on their respective fronthaul communication links. Although FIG. 1 illustrates one example of a wireless network 100, various changes may be made to FIG. 1. For example, the wireless network 100 could include any number of eNBs and any number of UEs in any suitable arrangement. Also, the eNB 101 could communicate directly with any number of UEs and provide those UEs with wireless broadband access to the network 130. Similarly, each eNB 102-103 could communicate directly with the network 130 and provide UEs with direct wireless broadband access to the network 130. Further, the eNBs 101, 102, and/or 103 could provide access to other or additional external networks, such as external telephone networks or other types of data networks.

FIG. 2 illustrates an example eNB 102 according to this disclosure. The embodiment of the eNB 102 illustrated in FIG. 2 is for illustration only, and the eNBs 101 and 103 of FIG. 1 could have the same or similar configuration. However, eNBs come in a wide variety of configurations, and FIG. 2 does not limit the scope of this disclosure to any particular implementation of an eNB.

As illustrated in FIG. 2, the eNB 102 includes multiple antennas 205a-205n, multiple RF transceivers 210a-210n, transmit (TX) processing circuitry 215, and receive (RX) processing circuitry 220. The eNB 102 also includes a controller/processor 225, a memory 230, and a backhaul or network interface 235.

The RF transceivers 210a-210n receive, from the antennas 205a-205n, incoming RF signals, such as signals transmitted by UEs in the network 100. The RF transceivers 210a-210n down-convert the incoming RF signals to generate IF or baseband signals. The IF or baseband signals are sent to the RX processing circuitry 220, which generates processed baseband signals by filtering, decoding, and/or digitizing the baseband or IF signals. The RX processing circuitry 220 transmits the processed baseband signals to the controller/processor 225 for further processing.

The TX processing circuitry 215 receives analog or digital data (such as voice data, web data, e-mail, or interactive video game data) from the controller/processor 225. The TX processing circuitry 215 encodes, multiplexes, and/or digitizes the outgoing baseband data to generate processed baseband or IF signals. The RF transceivers 210a-210n receive the outgoing processed baseband or IF signals from the TX processing circuitry 215 and up-converts the baseband or IF signals to RF signals that are transmitted via the antennas 205a-205n.

The controller/processor 225 can include one or more processors or other processing devices that control the overall operation of the eNB 102. For example, the controller/processor 225 could control the reception of forward channel signals and the transmission of reverse channel signals by the RF transceivers 210a-210n, the RX processing circuitry 220, and the TX processing circuitry 215 in accordance with well-known principles. The controller/processor 225 could support additional functions as well, such as more advanced wireless communication functions. For instance, the controller/processor 225 could support beam forming or directional routing operations in which outgoing signals from multiple antennas 205a-205n are weighted differently to effectively steer the outgoing signals in a desired direction. Any of a wide variety of other functions could be supported in the eNB 102 by the controller/processor 225. In some embodiments, the controller/processor 225 includes at least one microprocessor or microcontroller.

The controller/processor 225 is also capable of executing programs and other processes resident in the memory 230, such as an OS. The controller/processor 225 can move data into or out of the memory 230 as required by an executing process.

The controller/processor 225 is also coupled to the backhaul or network interface 235. The backhaul or network interface 235 allows the eNB 102 to communicate with other devices or systems over a backhaul connection or over a network. The interface 235 could support communications over any suitable wired or wireless connection(s). For example, when the eNB 102 is implemented as part of a cellular communication system (such as one supporting 5G, LTE, or LTE-A), the interface 235 could allow the eNB 102 to communicate with other eNBs over a wired or wireless backhaul connection. When the eNB 102 is implemented as an access point, the interface 235 could allow the eNB 102 to communicate over a wired or wireless local area network or over a wired or wireless connection to a larger network (such as the Internet). The interface 235 includes any suitable structure supporting communications over a wired or wireless connection, such as an Ethernet or RF transceiver.

The memory 230 is coupled to the controller/processor 225. Part of the memory 230 could include a RAM, and another part of the memory 230 could include a Flash memory or other ROM.

As described in more detail below, the eNB 102 may include circuitry for OFDM signal compression on its fronthaul communication links. For example, the controller/processor 225 may be a REC, DU, or BBU, and the RF Transceivers 210a-210n may be local or remote radio units, such as Radio Equipment (RE), RUs, and/or RRH, with OFDM signal compression and decompression being implemented on one or more of the links there between.

Although FIG. 2 illustrates one example of eNB 102, various changes may be made to FIG. 2. For example, the eNB 102 could include any number of each component shown in FIG. 2. As a particular example, an access point could include a number of interfaces 235, and the controller/processor 225 could support routing functions to route data between different network addresses. As another particular example, while shown as including a single instance of TX processing circuitry 215 and a single instance of RX processing circuitry 220, the eNB 102 could include multiple instances of each (such as one per RF transceiver). Also, various components in FIG. 2 could be combined, further subdivided, or omitted, and additional components could be added according to particular needs.

Figure 3:
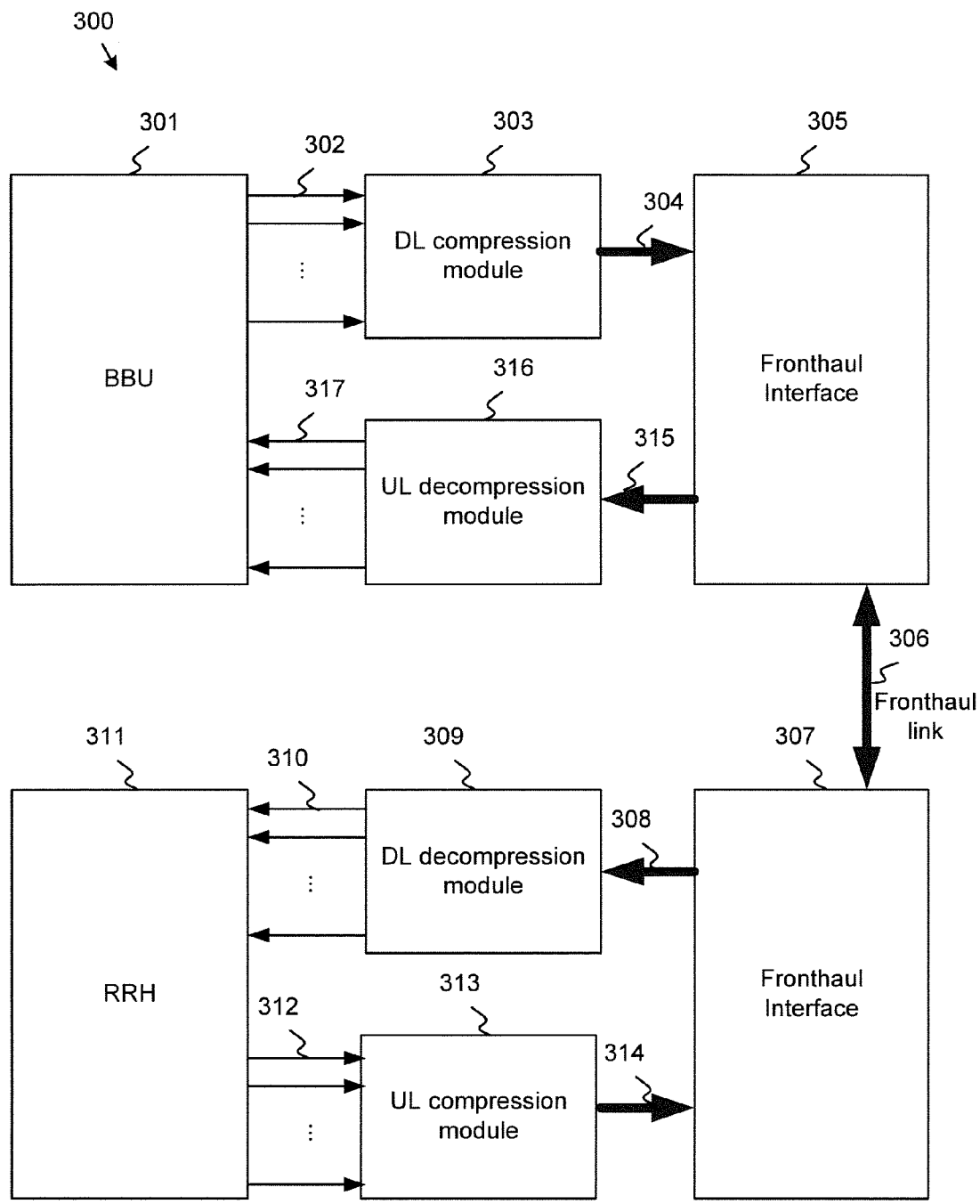
FIG. 3 illustrates a BBU-RRH system with fronthaul compression/decompression according to various embodiments of the present disclosure.

FIG. 3 illustrates a BBU-RRH system 300 with fronthaul compression/decompression according to various embodiments of the present disclosure. For example, the system 300 may be located in a base station, such as, for example, eNodeB 102 in FIG. 2. In this illustrative example, system 300 includes compression/decompression modules 303, 309, 316, and 313. In the downlink, the output of the BBU 301 may be time-domain complex OFDM symbol waveforms 302, e.g., complex Inverse Fast Fourier Transform (IFFT) signals including a cyclic prefix (CP), with one OFDM symbol per antenna port. The OFDM symbols are compressed by the DL compression module 303, and the compressed signals 304 are input to the fronthaul interface 305 that formats the signals for transmission over the fronthaul link 306. The data is then transported via the fronthaul link 306 and received at the fronthaul interface 307 on the side of the RRH 311. The data 308 from the fronthaul interface 307 is then decompressed by a DL decompression module 309 (e.g., applies the reverse operation of the compression module 303). The output of the DL decompression module 309 is the recovered OFDM symbols (one symbol per antenna port) including the cyclic prefix which is then processed and transmitted by the RRH 311 (e.g., to a UE).

A similar processing sequence can also take place in the uplink as illustrated in FIG. 3. For example, the output of the RRH 311 may be time-domain complex OFDM symbol waveforms 312, e.g., complex Inverse Fast Fourier Transform (IFFT) signals including a cyclic prefix (CP), with one OFDM symbol per antenna port. The OFDM symbols are compressed by the UL compression module 313, and the compressed signals 314 are input to the fronthaul interface 307 that formats the signals for transmission over the fronthaul link 306. The data is then transported via the fronthaul link 306 and received at the fronthaul interface 305 on the side of the BBU 301. The data 308 from the fronthaul interface 305 is then decompressed by a UL decompression module 316 (e.g., applies the reverse operation of the compression module 313). The output of the UL decompression module 316 is the recovered OFDM symbols (one symbol per antenna port) including the cyclic prefix which is then processed and transmitted by the BBU 301 (e.g., to a backhaul or network interface). The DL compression modules 303 and 309 can be the same or can be different than the UL compression modules 313 and 316.

Figure 4:
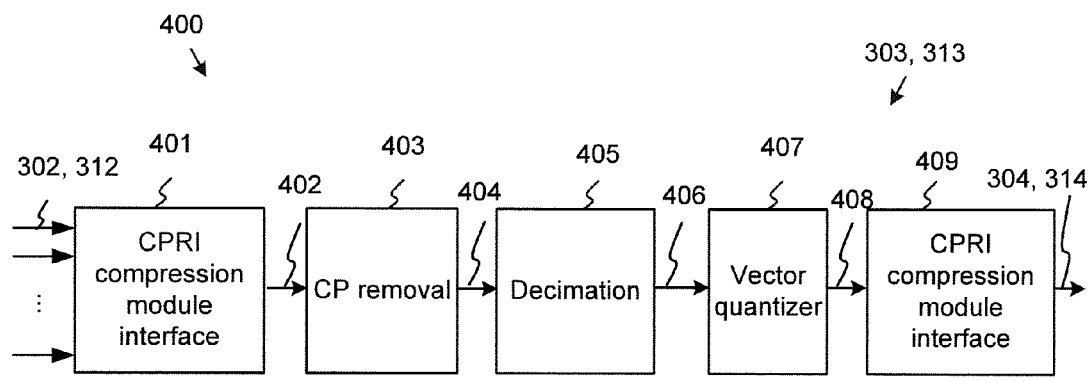
FIG. 4 illustrates a block diagram of a CPRI compression processing chain according to various embodiments of the present disclosure.

FIG. 4 illustrates a block diagram of a CPRI compression processing chain 400 according to various embodiments of the present disclosure. In this example of the compression modules 303 and/or 313, the inputs (302, 312) to the compression module (303, 313) are formatted by the CPRI compression module interface 401. The formatted signals 402 are sent to a cyclic prefix removal block 403, where the cyclic prefix of each time-domain OFDM symbol is removed to produce output signal 404. For example, if the CP length is 1/8 of the useful symbol length, then the compression ratio achieved just from CP removal is 8/9. Given that the CP may simply be redundant data, the recipient of the compressed output of the compression module (303, 313), (e.g., the decompression module (309, 316)) may be perfectly capable to generate a new CP that can be used by later recipients of the signal transmitted (UL or DL) by the base station.

The signal 404 is then processed by the decimation block 405. Decimation block 405 performs sampling rate conversion to a lower rate to produce signal 406. As will be discussed in greater detail below, the decimation block 405 samples the signal 404 to provide signal samples 406 which are vectorized, as discussed in greater detail below. The signal 406 is a complex signal meaning that the signal 406 is composed of real and imaginary parts (i.e., i and j components). In this manner, the output of the decimation block 405 are complex samples of the received signal which are vectorized. The signal 406 is then processed by vector quantizer block 407. Vector quantizer block 407 further compresses the signal 406 to produce the signal 408. Vector quantizer block 407 performs vector quantization, which includes mapping a sample vector to a quantization vector according to a vector quantization codebook stored, configured or hardcoded in an internal memory of the compression module (303, 313). The output signal 408 represents a code point or codeword index in a vector quantization codebook. Further details of the processing in the vector quantization block are described below. The CPRI compression module interface 409 formats signal 408 as signal (304, 314) suitable to be processed by the fronthaul interface 305. For UL CPRI compression, the CP removal block may not be present if the original samples of the CP need to be preserved for processing at the BBU 301. An additional block can also be inserted in the compression chain 400; for example, block scaling which scales or normalizes a block of input signals by the sample value within the block with the maximum magnitude can also be applied. The block scaling module may be located in between the decimation block 405 and the vector quantizer block 407. The block scaling factor can vary by block to block and be transmitted over the CPRI link once every block so that the reverse process of block scaling can be performed at the decompression module (309, 316).

Figure 5:
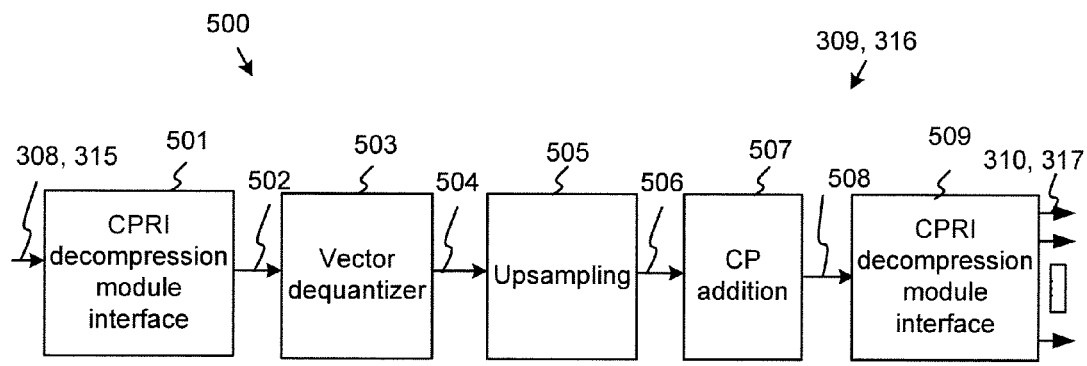
FIG. 5 illustrates a block diagram of a CPRI decompression processing chain according to various embodiments of the present disclosure.

FIG. 5 illustrates a block diagram of a CPRI decompression processing chain 500 according to various embodiments of the present disclosure. The CPRI decompression processing chain 500 can be the reverse of the CPRI compression processing chain 400. The CPRI decompression module interface 501 formats the input (308, 315) to the decompression module (309, 316). The formatted signals 502 are sent to vector dequantizer block 503. Vector dequantizer block 503 decompresses the signal 502 to produce the signal 504 (further details of processing in the vector dequantizer block 503 are described below). The signal 504 is then processed by upsampling block 505. Upsampling block 505 converts the sampling rate to a higher rate to produce signal 506. CP addition block 507 then processes the signal 506 to add back a cyclic prefix of each time-domain OFDM symbol to produce output signal 508. The CPRI decompression module interface 509 then formats the signal 508 to be signals (310, 317), which are time-domain OFDM symbols for the antenna ports. For the UL CPRI decompression, the CP addition block 507 may not be present if the CP removal was not performed during compression. An additional block can also be inserted in the decompression chain; for example, if block scaling is performed at the compression module (303, 313) as described above, the reverse process of block scaling may be performed, for example, between the vector dequantizer block 503 and the upsampling block 505.

The compression and decompression processing as discussed with respect to CPRI links or fronthaul links can be applied to any application involving OFDM data compression, i.e. possible application of the embodiments is not limited to data compression over CPRI links. Moreover, embodiments of the present disclosure may be implemented over other fronthaul links beyond CPRI links. CPRI compression is used as an example application for one or more embodiments of the present disclosure. The CPRI Specification V6.1 (Jul. 1, 2014) is incorporated by reference herein.

Figure 6:
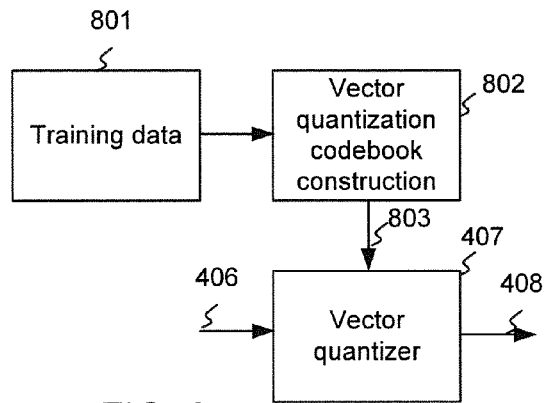
FIG. 6 illustrates a block diagram for vector quantization codebook construction according to various embodiments of the present disclosure.

FIG. 6 illustrates a block diagram for vector quantization codebook construction according to various embodiments of the present disclosure. In various embodiments, the vector quantization codebook used by the vector quantizers 407 and 503 may be generated in advance or offline using training data. For example, the vector quantization codebook may be specific to a particular set of base stations, base station, or RRH. To generate the vector quantization codebook, the vector quantizer codebook construction block 802, which may be implemented by one or more components in the wireless network, (e.g., the compression module (303 or 313), the controller/processor 225, the processing circuitry 215 or 220 for the BBU of the RF transceivers 210) may use a set of training data 801 as an input. The training data is a set of sample data that is considered representative of the actual signals to be compressed. For example, the training data may be modeled as a Gaussian complex random sequence, or the training data may be time-domain complex OFDM symbol samples generated using simulation software. The training data can also be obtained from real/live network traces (e.g., signals received from UEs or over the backhaul network).

The vector quantization codebook construction block 802 outputs vector quantization codebook 803. The codebook can be stored, configured or hardcoded in an internal memory of the compression/decompression modules (303, 309, 313, 316) or stored on a cloud server. The vector quantization codebook construction block 802 may also construct and store multiple codebooks, where each codebook can be constructed based on different sets of training data, based on different vectorization methods, and/or based on different system configuration, such as the number of antenna ports. Depending on the input 406, the selected vectorization method, and/or the system configuration, the vector quantizer 407 (or other component in the network 100) may select the codebook from the codebook set for vector quantization. The selected codebook is also known at the vector dequantizer block 503. The codebook selection can vary over time and, in these embodiments, the compression module (303, 313) may send information about the selected codebook over the fronthaul link 306.

Figure 7:
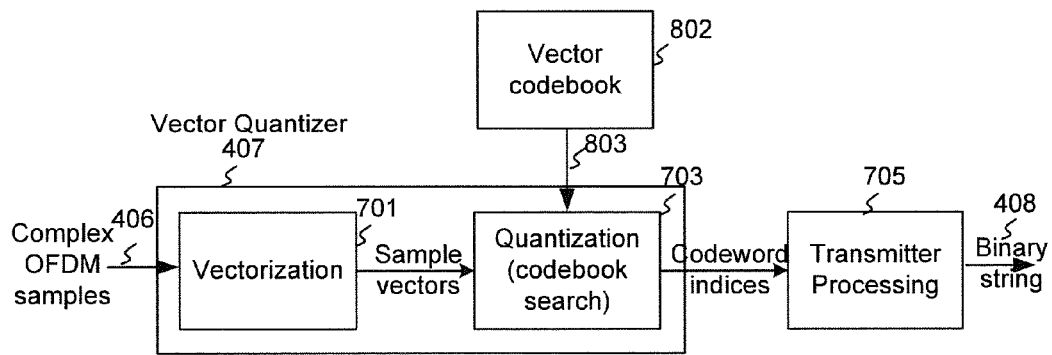
FIG. 7 illustrates a block diagram of a vector quantization block according to various embodiments of the present disclosure.

FIG. 7 illustrates a block diagram of the vector quantizer block 407 according to various embodiments of the present disclosure. As illustrated, the vector quantizer block 407 may include three sub-blocks. The vectorization sub-block 701 receives the complex OFDM samples 406 as inputs and vectorizes (e.g., constructs vectors) from samples 406 in vectors of a certain length based on a vectorization method. In this disclosure, complex samples have real and imaginary parts and are sampled from a received complex signal (e.g., received time-domain complex OFDM symbol waveforms). The vector length may be determined based on constraints, such as latency, in terms of codebook search, codebook size, and target quantization performance. Since OFDM samples are complex-valued, there are many different ways to vectorize them. Some example vectorization methods are described below. The vector quantizer block 703 performs a codebook search to quantize or map the constructed sample vectors to the codewords from the vector codebook based on some metric, such as, for example, minimum Euclidean distance. The output of the quantization sub-block 703 is the codeword indices corresponding to the vector codewords. The transmitter processing sub-block 705 receives codeword indices as input and maps the codeword indices to a binary string. In one example, the mapping is uniform in which it is assumed that all codewords of the vector codebook are equally likely and are hence mapped to binary strings of equal lengths. In another example, the mapping is non-uniform in which the codewords are assumed to have different probabilities of occurrence and are hence mapped to binary strings of different lengths depending on their occurrence probabilities. An example of such non-uniform mapping is entropy coding, additional details of which are discussed in greater detail below. The transmitter processing sub-block 705 may map every codeword index to a binary string (i.e., performs separate mapping) or map multiple codeword indices jointly to a binary string (i.e., performs joint mapping). While the transmitter processing sub-block 705 is illustrated to be outside of the vector quantizer block 407, the transmitter processing sub-block 705 may also be included inside the vector quantizer block 407.

Figure 8:
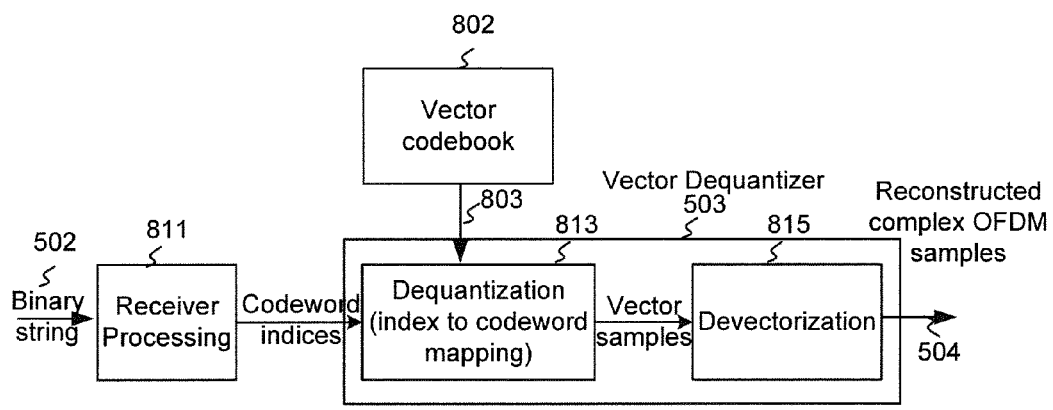
FIG. 8 illustrates a block diagram of a vector dequantization block according to various embodiments of the present disclosure.

FIG. 8 illustrates a block diagram of the vector dequantizer block 503 according to various embodiments of the present disclosure. As illustrated, the vector dequantizer block 503 also includes three sub-blocks to perform operations in a reverse order than the vector quantizer block 407. Receiver processing sub-block 811 receives the binary string 502 as an input (e.g., from the vector quantizer block 407 over fronthaul link 306) and processes the string 502 to output codeword indices. The dequantization sub-block 813 maps the codeword indices to vector codewords from the vector codebook to output reconstructed vector samples (e.g., based on having been signaled the codebook in use). The devectorization sub-block 815 then devectorizes the vector samples into complex OFDM samples, for example, based on the vectorization method used in the vector quantizer block 407. While the receiver processing sub-block 811 is illustrated to be outside of the vector dequantizer block 503, the receiver processing sub-block 811 may also be included inside the vector dequantizer block 503.

Embodiments of the present disclosure utilize vector quantization to compress transmitted OFDM signals. Vector quantization involves the mapping of sample vectors to quantization vectors. Given M sample vectors $S_m$, each of length L, and K quantization vectors $c_k$, also of length L, the vector quantizer $Q(\bullet)$ maps a sample vector $S_m$ to one of K quantization vectors: $Q(S_m)=c_k$, based on a distortion metric $d(.,.)$. For example, the metric may be Euclidean distance, and the source vector $S_m$ is quantized to $c_k$ when $d(c_k,S_m) \leq d(c_n,S_m)$ for all n. Each compressed sample vector is represented by $\lceil \log_2 K \rceil$ bits, and hence the compression achieved with the vector quantization is $$\frac{\lceil \log_2 K \rceil}{L}$$

bits per scalar sample. The compression achieved improves with increasing vector length. The vector quantization of all sample vectors results in sample vectors partitioned into K partition regions corresponding to K quantization vectors. Using the notation $R_k$ to denote the set of sample vectors that are mapped to the quantization vector $c_k$ and given a set of sample vectors $R=\{S_m, m=1, \ldots, M\}$, where $S_m=\{s_m^1, s_m^2, \ldots, s_m^L\}$ is a L×1 vector constructed from the OFDM samples that need to be quantized, various embodiments of the present disclosure generate and utilize a vector quantization codebook $C=\{c_k: k=1, 2, \ldots, K\}$ such that the distortion $$D(C) = \frac{1}{M} \sum_{m=1}^{M} \min_{c_k \in C} d(c_k, S_m)$$

is minimum for a given distortion metric $d(.,.)$.

In some example embodiments, the Lloyd or Linde-Buzo-Gray (LBG) algorithm is an iterative algorithm that can be used to construct the quantization codebook. The algorithm starts with an initial choice of codebook from the set of sample vectors, and in each iteration of the algorithm, the set of sample vectors is partitioned into partitions using the codebook from the previous iteration, and then the codebook is updated using the obtained partitions. The algorithm ends when a stopping criterion is met.

In an example embodiment, the details of implementing the codebook generation algorithm are as follows:

1. Initialization: pick a distortion threshold $\epsilon>0$, set iteration index i=0, initialize codebook $C^0=\{c_n^0: n=1, 2, \ldots, K\}$ where $c_1^0, \ldots, c_K^0$ can be drawn randomly from R, and set $D(C^{-1})=\infty$.
2. Minimum distortion partition: Find the partition region $R(C^i)=\{R_k: k=1, 2, \ldots, K\}$ of the sample vectors $S_m$ according to Equation 1 below:

$S_m \in R_k$ if $d(c_k,S_m) \leq d(c_n,S_m)$ for all $n$     [Equation 1]

with the distortion computed according to Equation 2 below:

$$D(C^i) = \frac{1}{M} \sum_{m=1}^{M} \min_{c_k \in C^i} d(c_k, S_m) \quad \text{[Equation 2]}$$

3. Stopping criterion: If $$\frac{|D(C^i) - D(C^{i-1})|}{D(C^i)} < \varepsilon,$$

the algorithm ends and $C^i$ is the constructed codebook. Otherwise, continue.
4. Codebook update: $C^{i+1}=\{c_k: k=1, 2, \ldots, K\}$ where the codewords are updated according to $c_k=g(R_k)$ where $g(\bullet)$ is the chosen estimator. For example, the mean square error (MSE) estimator $$c_k = g(R_k) = \frac{1}{\|R_k\|} \sum_{s_m \in R_k} S_m,$$

where $\|R_k\|$ is the size of the partition $R_k$.
5. Increment i by 1 and return to minimum distortion partition in step 2.

It is possible for this algorithm to converge locally. To minimize the probability of local convergence, multiple trials may be used, where in each trial initial codebooks $C^0$ in the initialization in step 1 is drawn randomly from the set of sample vectors. The codebook resulting from the trial with the smallest final distortion $D(C^i)$ among all the trials is used as the final codebook for quantization.

Embodiments of the present disclosure recognize that the codebook size that meets the desired performance may be very large, which may lead to a codebook search complexity and latency issues. Hence, various embodiments of the present disclosure reduce the complexity of the quantization of the OFDM samples.

Figure 9:
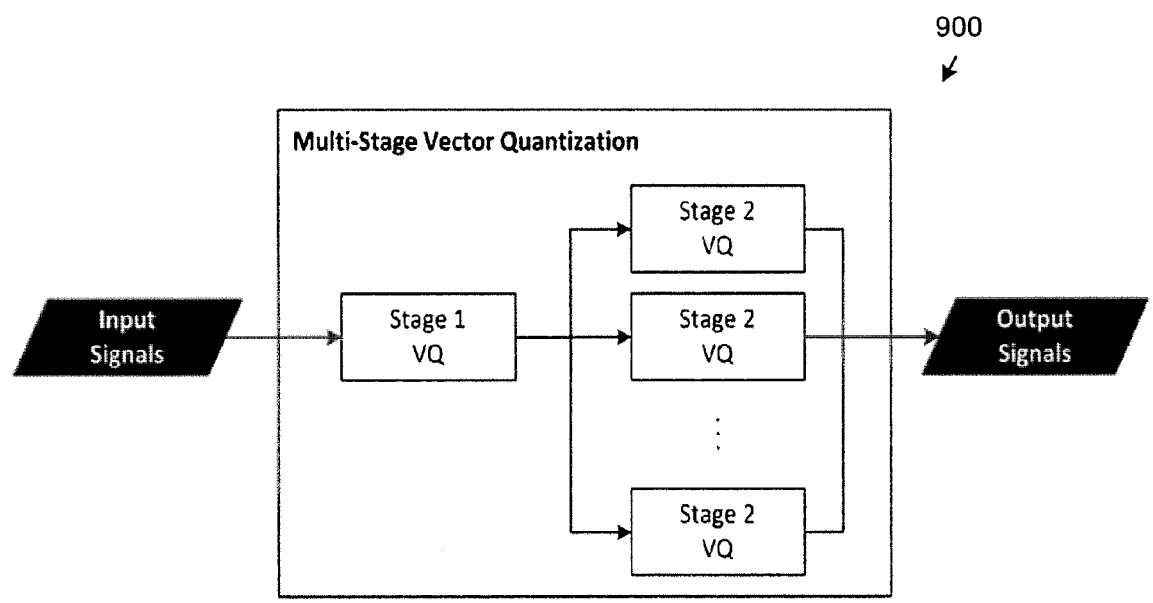
FIG. 9 illustrates a block diagram of a multi-stage vector-quantization block according to various embodiments of the present disclosure.

FIG. 9 illustrates a block diagram of a multi-stage vector-quantization block 900 according to various embodiments of the present disclosure. Multi-stage vector-quantization block 900 in FIG. 9 may be an example of one embodiment of the vector quantizer block 407 in FIG. 4. The structured codebook with multiple quantization levels or stages is one way to achieve this by having a multi-level partitioned codebook in which the lower level or stage (i.e., smaller) codebook partitions the upper level (i.e., larger) codebook. During quantization, the multi-stage vector-quantization block 900 starts with the lowest level (i.e., smallest) codebook and obtains the quantization vector. The multi-stage vector-quantization block 900 uses the resultant quantized vector to identify one of the partitions of the upper level or stage codebook for quantization. The multi-stage vector-quantization block 900 uses the quantization vector from this partition to identify the partition in the next level or stage. The multi-stage vector-quantization block 900 continues this process until reaching the uppermost level and then quantizes the input signals using the selected or identified stages or levels.

Embodiments of the present disclosure provide multiple ways to construct and utilize a multi-level or stage structured codebook. One example embodiment is a tree structured multi-level vector quantization (MLVQ) codebook. For the number of codebook levels being J and the size of the codebook $C_j$ at level j being $K_j$, the codebook size increases as the higher the levels go starting from level 1. The codebooks that are at lower levels are used to partition those immediately above the lower level codebooks. In order to obtain a fixed compression rate and a fixed codebook search complexity, all codebook sizes can be assumed to be in powers of 2 and that for any two consecutive codebook levels, the size of the smaller codebook divides that of the larger codebook. This assumption means that all partitions at the same level can be chosen to be of equal size, which is desirable since it allows uniform hardware requirements and deterministic computational complexity. In one example, a tree-structured codebook may have three levels of sizes 2, 4, and 16 with each codeword at level 1 associated with a partition of size 2 at level 2 and, similarly, each codeword at level 2 being associated with a partition of size 4 at level 3.

In one example embodiment of quantization based on a tree-structured multi-level codebook, the vector quantizer block 407 quantizes a sample vector $S_m$ sequentially starting from level 1 until reaching level J. The vector quantizer block 407 uses the codeword from level j to identify the corresponding partition in level j+1. More precisely, for all j∈{1, 2, . . . , J}, iteration is performed to compute $\hat{c}_j=\arg\min_{c_k \in P_j} d(c_k, S_m)$, where for j>1, $P_j$ is the partition at level j associated with the codeword $\hat{c}_{j-1}$ of the codebook at level j−1 and $P_1=C_1$. Then, $\hat{c}_J$ is the quantization of $S_m$. In this quantization process, a sample vector $S_m$ is quantized to $\hat{c}_J$ by performing $$K_1, \frac{K_2}{K_1}, \ldots, \frac{K_J}{K_{J-1}}$$

codebook search operations at levels 1, 2, . . . , J, respectively. Thus, each compressed sample vector is represented by $$\lceil \log_2 K_1 \rceil + \left\lceil \log_2\left(\frac{K_2}{K_1}\right)\right\rceil + \ldots + \left\lceil \log_2\left(\frac{K_J}{K_{J-1}}\right)\right\rceil \text{ bits,}$$

which is equal to $\lceil \log_2 K_J \rceil$ because if $K_1, K_2, \ldots, K_J$ are in powers of 2.

Using the multi-level or stage codebook, the search complexity of this tree-structured multi-level codebook may be less. The number of codebook search operations is $$O = K_1 + \sum_{j=2}^{J} \frac{K_j}{K_{j-1}},$$

which can be significantly smaller than $K_J$, the number of codebook search operations using the optimal quantizer from the Lloyd algorithm embodiments discussed above. For example, for J=3 and $K_1=8$, $K_2=64$, and $K_3=1024$, the number of operations $O=8+64/8+1024/64=32$, which is $$\frac{1}{32} \text{ of } K_3 = 1024.$$

For example, the multi-stage vector-quantization block 900 may provide a fast codebook search with different complexities and allow quantization and search from any level and adaptive quantization depending on the affordable search time. The multi-stage vector-quantization block 900 may also provide for multi-resolution of quantization error, with coarse resolution obtained by quantization using the lowest level codebook and finer resolution obtained by quantization using multiple codebooks from the bottom.

Embodiments of the present disclosure also provide for construction of a tree-structured multi-level codebook. Tree-structured codebook construction is a codebook construction technique based on the partitioning of the set of sample vectors. Embodiments of the present disclosure first construct the level 1 codebook using the Lloyd algorithm, and then use the level 1 codebook to partition the set of sample vectors into $K_1$ partitions. Each of these partitions are in turn used to construct $K_1$ codebooks each of size $$\frac{K_2}{K_1}.$$

The sequential collection of these codebooks gives the codebook at level 2, with the construction process continuing similarly with levels 2 and 3, 3 and 4, etc. until reaching the level J. An example of construction of the tree-structured codebook is as follows:

Initialization (level 1): given the set of sample vectors R={$S_m$, m=1, . . . , M}, the Lloyd algorithm is run to obtain the level 1 codebook $C_1$.

For levels j=2, 3, . . . , J, the constructed codebook at level j−1 is used to partition all sample vectors in R into $K_{j-1}$ partitions. Denote the sets of partitioned sample vectors as $R_1, \ldots, R_{K_{j-1}}$, for each partition p=1, 2, . . . , $K_{j-1}$, the partitioned training set $R_p$ is used, and the Lloyd algorithm is invoked to construct the codebook $C_j^p$ of size $$\frac{K_j}{K_{j-1}}.$$

The codebook $C_j$ at level j is the sequential collection of all constructed codebooks $C_j^p$ for p=1, 2, . . . , $K_{j-1}$. The set of sample vectors is partitioned using the smaller codebook, and the sets of partitioned sample vectors are then used to obtain the partitions of the larger codebook.

Embodiments of the present disclosure recognize that some of the advantages of the tree-structured vector codebooks may include: a shorter design time and faster convergence because of the size of each partition at any level is small compared to the size of the final codebook at the same level; favorable performance in practice particularly when the source distribution is symmetric; enablement of a quick codebook search with different complexities; facilitation of adaptive quantization depending on the affordable search time because the quantization process can start from any level; and multiple resolution of quantization error with the coarse resolution corresponding to quantization using the lowest level codebook, and finer resolution corresponds to quantization using multiple codebooks from the bottom.

Figure 10:
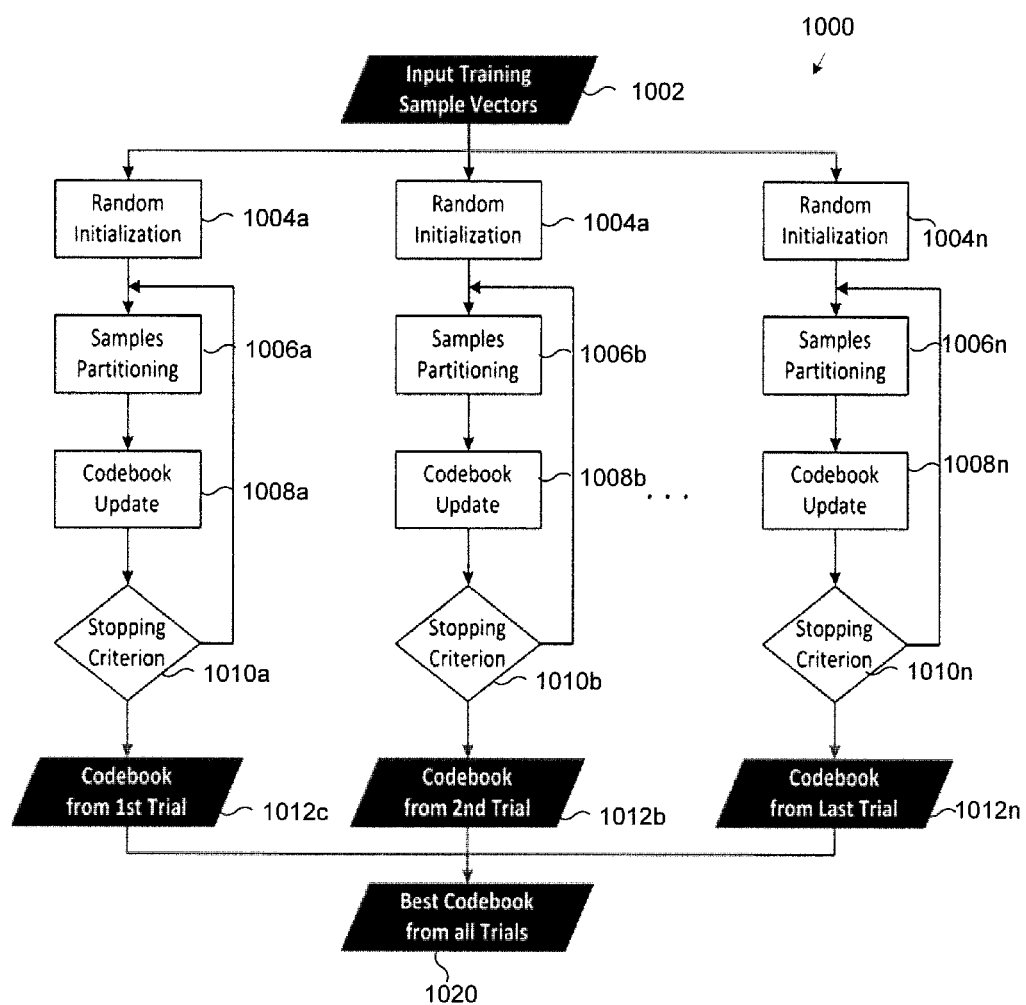
FIG. 10 illustrates a flowchart of a process for parallel generation of vector quantization codebooks according to various embodiments of the present disclosure.

FIG. 10 illustrates a flowchart of a process 1000 for parallel generation of vector quantization codebooks according to various embodiments of the present disclosure. The process illustrated in FIG. 10 may be performed by the processor/controller 225 in the eNodeB, by a RRH or BBU in a wireless network, or system level controller. For example, the vector quantization codebook construction block 802 may implement the process operating on the above-discussed exemplary structural elements.

Using a modified Lloyd algorithm as discussed above, some embodiments of the present disclosure aim to find evenly-spaced sets of points in subsets of Euclidean spaces and partitions of these subsets into well-shaped and uniformly-sized convex cells. The vector quantization codebook construction block 802 may start the codebook generation algorithm by randomly picking some number of point sites 1004 in the input samples 1002 and repeatedly executing codebook updating 1008 and samples partitioning 1006 in every iteration until reaching the stopping criterion 1010. Each time, the points are left in a slightly more even distribution: closely spaced points move farther apart, and widely spaced points move closer together. Finally, the algorithm terminates at certain local optimal if the stopping criterion 1010 is chosen properly. To this end, vector quantization codebook construction block 802 performs multiple codebook construction trials in parallel (a, b, . . . n) and chooses the best output 1020 from all trials 1012. However, for extremely concentrated input samples, e.g., OFDM samples, a parallel pattern may not be sufficient to overcome the sensitivity of initialization. Accordingly, embodiments of the present disclosure provide an algorithm for serial generation of vector quantization codebooks.

Figure 11:
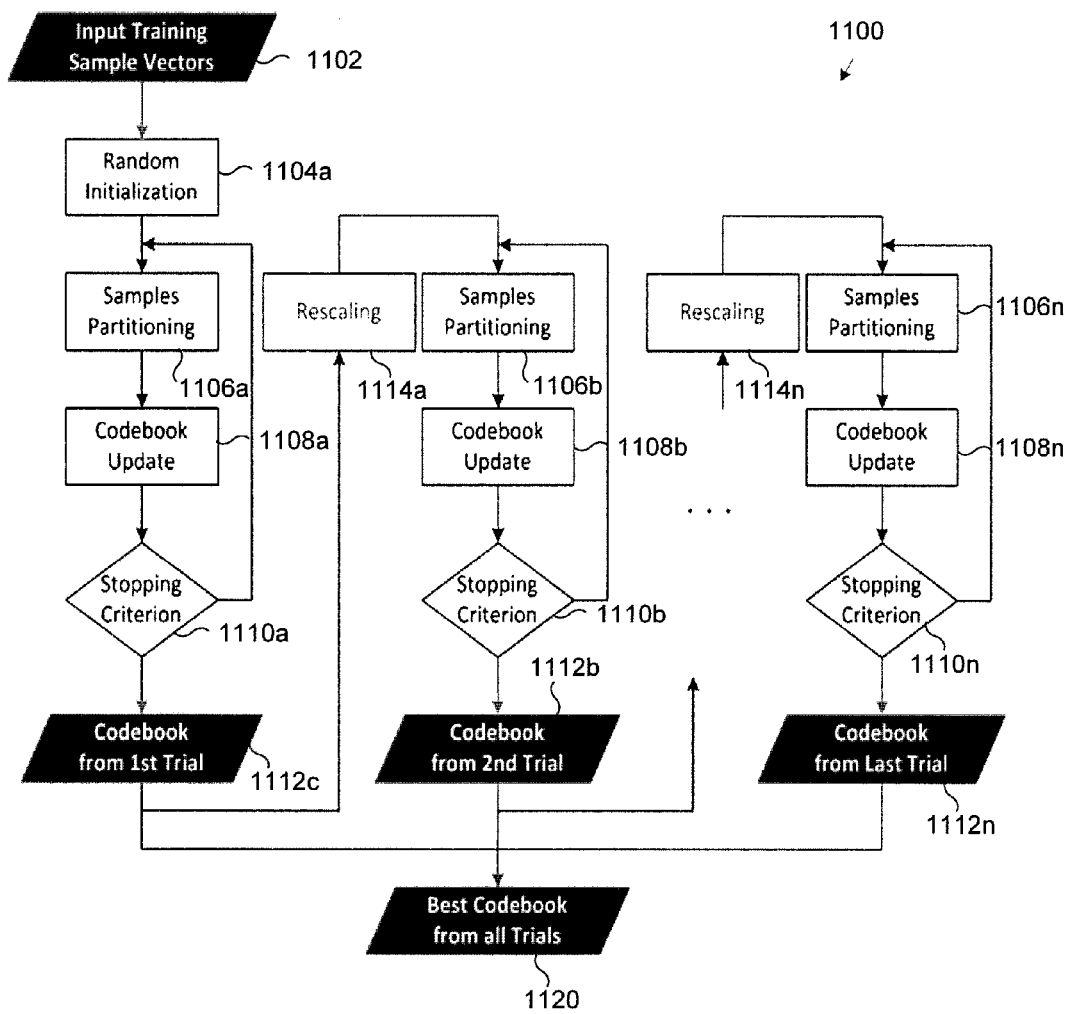
FIG. 11 illustrates a flowchart of a process for serial generation of vector quantization codebooks according to various embodiments of the present disclosure.

FIG. 11 illustrates a flowchart of a process 1100 for serial generation of vector quantization codebooks according to various embodiments of the present disclosure. The process illustrated in FIG. 11 may be performed by the processor/controller 225 in the eNodeB, by a RRH or BBU in a wireless network, or system level controller. For example, the vector quantization codebook construction block 802 may implement the process operating on the above-discussed exemplary structural elements.

In this illustrative embodiment, the vector quantization codebook construction block 802 may generate the initial codebook similarly as discussed above with respect to FIG. 10 by randomly picking some number of point sites 1104 in the input samples 1102 and repeatedly executing codebook updating 1108 and samples partitioning 1106 in every iteration until reaching the stopping criterion 1110. However, the vector quantization codebook construction block 802 utilizes the output 1112 from previous trial (a, b, etc.) and is utilized as the input (e.g., as the initial state) to the next trial after resealing 1114 of the codebook. The procedure of rescaling is useful, because the output from previous trial is already a local optimal. At this point, rescaling helps to avoid this local optimal problem and restart searching for a better solution. In one example, the extent of rescaling can depend on the average power, e.g., the average power of the output codebook should match the one of input samples such that widely-spaced points are avoided. Additionally, a uniform distributed initial codebook can be used as the initial state in the first trial, instead of the random initialization 1104 discussed above, which can be beneficial in accelerating the process of finding the codebook 1120.

Utilizing the above-discussed algorithm for vector quantization, a trained codebook may be more structured compared with the codebook from earlier discussed algorithm. Especially for the space where samples are densely concentrated, modified codebooks can naturally reflect the distribution of input samples, which may further result in smaller quantization error vector magnitude (EVM) and a higher compression ratio.

Various embodiments of the present disclosure also provide universal compression for different SNRs, modulations, and channels. Codebook constructed from particular training samples may only apply to the corresponding system settings. However, in practice, system parameters, for example, channel types, channel SNRs, and modulation methods, may not be known before compression is performed. Accordingly, various embodiments of the present disclosure provide universal compression technique, i.e., a codebook that is robust to all or a large range of system parameters. In these embodiments, the superiority of a certain codebook for a particular system scenario may be sacrificed in exchange for reasonable or acceptable performance over a larger set of system scenarios. More precisely, investigation of codebooks trained over mismatched samples is performed, in order to find the sensitivity factors impacting the performance and to discover the most robust parameter contributing to the universal codebook. If such a result is infeasible, e.g., such parameter does not exist, a larger training sample pool mixing with different parameters is considered, such that the trained codebook could reflect the distributions of all parameters.

For example, for uplink OFDM samples with 4× target compression ratio, if vector length 2 multilevel quantization with decimation 5/8 is performed, a constructed codebook is not quite sensitive to modulations or channel types (see e.g., TABLES 2 and 3 below), and is slightly sensitive to SNRs (see e.g., TABLE 1 below). Still, the 5 dB codebook can be adopted as a universal codebook, since its EVM performances are acceptable for all SNR training samples. Accordingly, various embodiments of the present disclosure may utilize the codebook obtained from 5 dB SNR, 64QAM modulation, and AWGN channel as the universal codebook to perform MLVQ with vector length 2 for all cases.

TABLE 1 example of SNRs mismatch for uplink samples implemented with MLVQ (vector length 2).

| EVM (%) | | training samples | | |
|---|---|---|---|---|
| | | 0 dB | 5 dB | 20 dB |
| codebook | 0 dB | 2.55 | 2.72 | 2.89 |
| | 5 dB | 3.11 | 2.54 | 2.55 |
| | 20 dB | 8.29 | 4.08 | 2.52 |

TABLE 2 example of Modulations mismatch for uplink samples implemented with MLVQ (vector length 2).

| EVM (%) | | training samples | | |
|---|---|---|---|---|
| | | QPSK | 16 QAM | 64 QAM |
| codebook | QPSK | 2.54 | 2.57 | 2.64 |
| | 16 QAM | 2.54 | 2.54 | 2.60 |
| | 64 QAM | 2.56 | 2.56 | 2.54 |

TABLE 3 example of channel types mismatch for uplink samples implemented with MLVQ (vector length 2).

| EVM (%) | | training samples | |
|---|---|---|---|
| | | AWGN | Ped B |
| codebook | AWGN | 2.54 | 2.56 |
| | Ped B | 2.64 | 2.52 |

Consider the same system setup but utilize vector length 3 multilevel quantization, the constructed codebook is extremely sensitive to SNRs, such that no single SNR codebook could be adopted as the universal one fitting for other SNR value samples (see e.g., TABLE 4 below). If a particular codebook is utilized to compress mismatched SNR samples, the distortion is even larger than the one from vector length 2 (e.g., compared with TABLE 1). To solve this problem, various embodiments of the present disclosure construct a larger training sample set, which contains subframes with diverse SNRs, and perform training over this database with a larger SNR region, then the resulting codebook may not be optimal for the particular SNR, but it can achieve acceptable performance (e.g., ~2.0% EVM, which is better than the EVM from vector length 2) for the whole SNR region of concern.

TABLE 4 example of SNRs mismatch for uplink samples implemented with MLVQ (vector length 3).

| EVM (%) | | training samples | |
|---|---|---|---|
| | 0 dB | 10 dB | 20 dB |
| codebook 0 dB | 1.71 | 2.75 | 2.72 |
| 10 dB | 2.79 | 1.67 | 2.70 |
| 20 dB | 2.88 | 2.77 | 1.62 |

Various embodiments of the present disclosure utilize entropy encoding. Entropy encoding is a lossless data compression scheme that is independent of the specific characteristics of the medium. In various embodiments of the present disclosure, entropy encoding is integrated with vector quantization to further compress the output codebook from quantization block. Accordingly, various embodiments of the present disclosure obtain a further compression ratio gain by comparing the average encoded length with the size of codebook.

Figure 12:
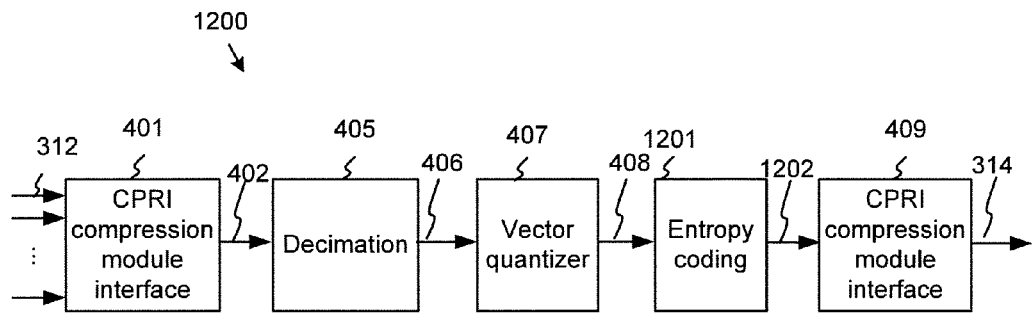
FIG. 12 illustrates a block diagram of an uplink CPRI compression processing chain integrated with entropy encoding according to various embodiments of the present disclosure.

An example of application of entropy encoding to CPRI compression is illustrated for uplink CPRI compression processing chain 1200 in FIG. 12. In this illustrative embodiment, the uplink CPRI compression processing chain 1200 additionally includes entropy coding block 1201 which produces an entropy coded output 1202, which is processed by the CPRI compression module interface 409. Entropy encoding can also be applied to a downlink CPRI compression system in a similar manner.

Some embodiments of the present disclosure utilize Huffman coding, where the approximate entropy characteristics of a data stream are known in advance. For general, binary Huffman coding, every step combines two remaining symbols with least probabilities and merges them into a new one. In this way, the dictionary construction procedure can be finished in linear time, and the final codeword for each symbol can be simply constructed from a binary splitting tree beginning from the root. According to Shannon's source coding theorem, the optimal average coded length for a distribution is its entropy, and Huffman codes are proven to be optimal with linear time complexity for symbol-by-symbol coding.

For CPRI compression, training sequence passes through vector quantization codebook construction block 802 such that a VQ codebook with target size is formed. Based on this codebook, samples in the training sequence can be quantized into codewords in the codebook, minimizing the objective distortion function. In this manner, the corresponding PMF, associated to the samples and codebook, can be calculated by the fraction of partitioned samples. Then, Huffman coding is further performed on the resulting PMF to compress the redundancy from the distribution of codebook.

TABLE 5 illustrates simulation results when integrated with entropy coding. An extra compression ratio gain can be obtained for all cases, where this improvement may result from the non-uniform distribution of a constructed codebook. Hence, for higher SNR scenarios, the gain from entropy coding could be more significant.

TABLE 5 example uplink simulation results with Huffman coding (simulation scenario is 64 QAM, 20 dB SNR, AWGN channel, and decimation 5/8).

| | | Bits per I/Q | | |
|---|---|---|---|---|
| | | 5 | 6 | 7 |
| MLVQ (VL = 2) | EVM (%) | 4.55 | 2.55 | 1.65 |
| | CR | 4.80 | 4.00 | 3.43 |
| | CR with Huffman | 5.01 | 4.16 | 3.54 |
| MLVQ (VL = 3) | EVM (%) | 3.89 | 1.71 | 1.19 |
| | CR | 4.80 | 4.00 | 3.43 |
| | CR with Huffman | 5.03 | 4.15 | 3.66 |

However, Huffman codes may not be desired or optimal when the probability mass functions are unknown, or when the distribution is incorrectly estimated in advance. Accordingly, when utilizing a universal Huffman code overall cases may risk suboptimality from mismatch coding. Theoretical analysis indicates the loss due to mismatched Huffman codes could be estimated by the K-L divergence between estimated distribution and the genuine one. Fortunately, for OFDM symbols, although the system parameters diverge for difference applications, like SNR, modulation, and channels types, the distribution of data sequence does not change much, such that the mismatched Huffman codes could still work for a wider scope of scenarios. Accordingly, some embodiments of the present disclosure may always utilize the universal Huffman codes, corresponding to the universal vector quantization codebook, to perform entropy encoding.

Various embodiments of the present disclosure provide multi-group quantization (MGQ). For a CPRI compression with a lower distortion requirement (e.g., low EVM), the size of codebook for vector quantization (VQ) may be larger, which may lead to a longer training time, larger storage requirements, and a slower encoding process. Accordingly, various embodiments of the present disclosure provide multi-group quantization method. Each signal sample can be written as a sum of powers of 2 through binary expansion (or as a binary number). Each power of 2 is referred to as a level. For example, the number 17.5 can be represented as $1 \times 2^4 + 0 \times 2^3 + 0 \times 2^2 + 0 \times 2^1 + 1 \times 2^0 + 1 \times 2^{-1}$ (or $10001.1_2$) which takes the value 1 for level 4, level 0 and level −1, and the value 0 for level 3, level 2 and level 1. The sign bit and the higher levels are clearly more significant than the lower levels. As such, various embodiments recognize that levels after expansion should not be treated equivalently, and more focus should be on the significant levels. Accordingly, various embodiments utilize MGQ, which separates a signal sample into 3 groups: the sign bit, a group of higher levels, and a group of lower levels, where each group is applied with different quantization schemes, depending on their significance.

Figure 15:
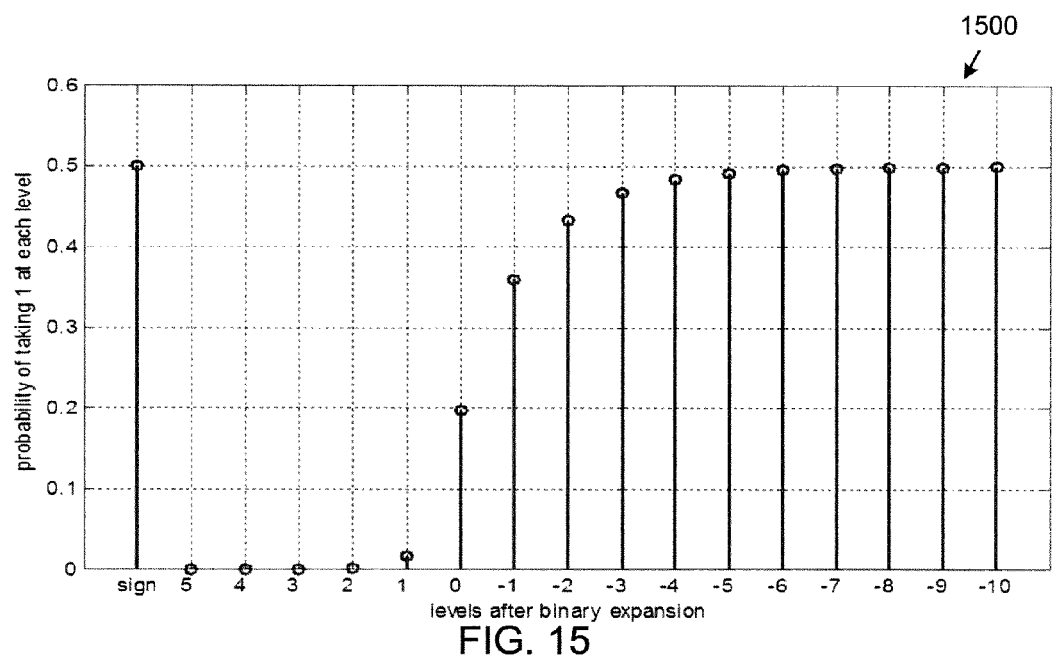
FIG. 15 illustrates a graph of an example of binary-expanded bit levels for normalized signals according to various embodiments of the present disclosure.

FIG. 15 illustrates a graph 1500 of example of binary-expanded bit levels for normalized signals according to various embodiments of the present disclosure. This example illustrates statistics of levels after binary expansion for OFDM/SC-FDM (e.g., LTE/LTE-Advanced) normalized signals. X-axis is the level index for base-2 expansion (e.g., value −2 means the weight of corresponding level is $2^{-2}$), and Y-axis shows the corresponding probability of taking value 1 at each level. The probability of taking 1 tends to 0.5 for the lower levels, and tends to 0 for higher levels due to power constraint. Besides, the sign of signal samples constitutes a separate level, which approximates Bernoulli 0.5 distribution due to the symmetry of signals in this case.

Based on this observation, in order to enable low distortion and efficiently utilize coding rate, the levels are partitioned into multiple groups and different quantization schemes are applied to different groups.

For example, for sign bit level (e.g., Group 1), no quantization or entropy coding may be performed. 1 bit can be utilized to perfectly represent the sign of signal, since any error from the sign will lead to large EVM. For higher levels above a threshold (e.g., Group 2), vector quantization combining with entropy coding is utilized to exploit the correlation among signals, and to fully compress the redundancy in codebook after vector quantization. If the probability mass function of the levels is non-uniform in this group, entropy coding provides a significant gain to reduce the actual rate transmitted on CPRI link. The threshold that separates the higher levels and the lower levels can be a design parameter, which can be tuned or optimized according to a desired objective. For lower levels below the threshold (e.g., Group 3), scalar quantization with entropy coding can be utilized. For example, uniform scalar quantization or non-uniform scalar quantization using a Lloyd algorithm or other algorithms can be used. In another example, vector quantization with a smaller vector length compared to that applied to Group 2 can be used. For these levels, correlation among levels becomes minute due to their smaller weights in the expansion. If the threshold is chosen such that all lower levels are almost Bernoulli 0.5 distributed, then, entropy coding may not be utilized in this case.

Figure 13:
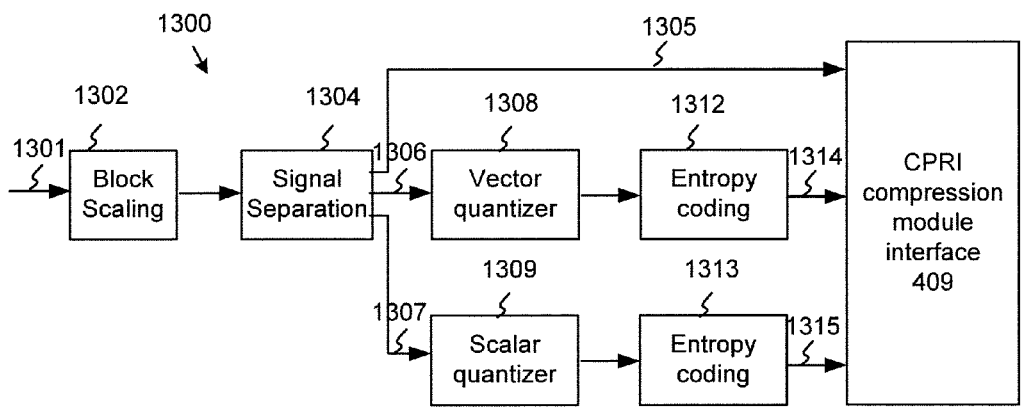
FIG. 13 illustrates a block diagram of a multi-group quantization processing chain according to various embodiments of the present disclosure.

FIG. 13 illustrates a block diagram of a multi-group quantization processing chain 1300 according to various embodiments of the present disclosure. The MGQ processing chain 1300 may be an example of one embodiment of the vector quantizer block 407 in FIGS. 4 and 12. The input 1301 to MGQ processing chain 1300 may be the resampled LTE complex signal sequence from the decimation block 405. Block scaling block 1302 normalizes the power of the signal based on a power detection technique (other block scaling techniques may also be applied for different purposes, e.g., truncating the magnitude of signals to limit the magnitude). The signal separation block 1304 splits the normalized complex signal sequence into 3 subsequences in, where real part and imaginary part of complex signals are considered respectively. The first signal subsequence 1305 includes the sign of both the real and imaginary part of the complex OFDM/SC-FDM signals (Group 1), and this sequence with rate 1 is transmitted on the CPRI link.

The second subsequence 1306 includes the higher-valued component of signals above a specified threshold. More precisely, if the threshold is chosen as 0, which is an integer, the higher part (Group 2) of a real signal s can be expressed as $2^\theta \cdot \lfloor |s| \cdot 2^{-\theta} \rfloor$. Then, vector quantizer 1308 and entropy coding 1312 are performed (for example, as discussed above with respect to FIG. 12 above) on this subsequence to obtain a binary string 1314. Further, this string 1314 with a rate close to the entropy of codebook distribution from vector quantization is transmitted over a CPRI link.

The third signal sequence 1307 includes the lower-valued component of signals below the specified threshold (Group 3). Mathematically, for chosen threshold θ, the lower-valued component of signal s can be expressed as $|s| - 2^\theta \cdot \lfloor |s| \cdot 2^{-\theta} \rfloor$. Then, scalar quantizer 1309 and associated entropy coding 1313 are performed over this set of data, such that the encoded flow 1315 is transmitted over the CPRI link. Entropy coding may not be performed for the scalar quantization chain, for the vector quantization chain, or for both chains in the MGQ processing chain 1300.

Figure 14:
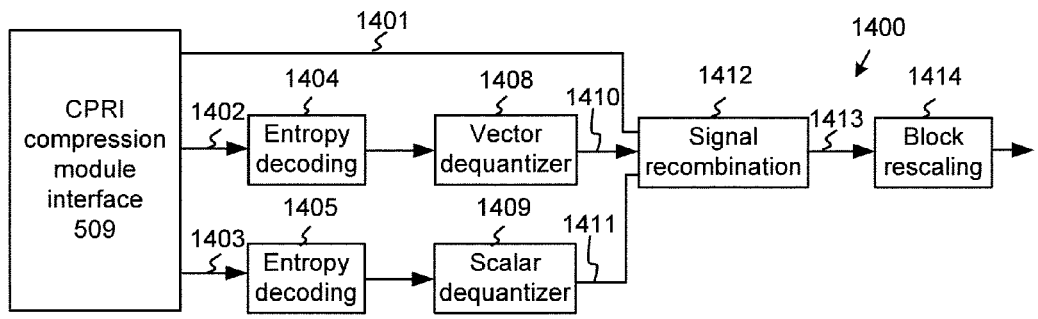
FIG. 14 illustrates a block diagram of a multi-group dequantization processing chain according to various embodiments of the present disclosure.

FIG. 14 illustrates a block diagram of a multi-group dequantization processing chain 1400 according to various embodiments of the present disclosure.

The multi-group dequantization processing chain 1400 operates similarly to MGQ processing chain 1300 but in the reverse manner. The three flows 1401, 1402, and 1403 from the CPRI link are considered separately using corresponding dequantization schemes. More precisely, the sign bit subsequence of flow 1401 can directly be received by the signal recombination block 1412. The remaining high level group of flow 1402 and low level group of flow 1403 are processed by entropy decoding blocks 1404 and 1405 and dequantization blocks (vector) 1408 and (scalar) 1409 successively to obtain estimates 1410 and 1411 of corresponding signals. These three groups of signal parts are recombined by signal recombination block 1412, where the summation of higher level and lower level signal part is multiplied by the corresponding sign bit to formulate estimates 1413 of the resampled signals. The signals are rescaled to original power by block rescaling block 1414.

The multi-group quantization and dequantization processing chains 1300 and 1400 may be utilized as the vector quantization and entropy coding blocks for CPRI compression. In this manner, on the CPRI link, different rates from 3 groups are combined together, and the compression ratio from MGQ processing chains 1300 only can be calculated as according to Equation 3 below:

$$CR_{MGQ} = \frac{1 + \overline{L}_{High}/VL_{High} + \overline{L}_{Low}}{15} \quad \text{[Equation 3]}$$

where $\overline{L}_{high}$ is the average length of codewords (after entropy coding, if applied) for high levels (Group 2), and $\overline{L}_{Low}$ is the corresponding one for low levels (Group 3) (scalar quantization assumed); $VL_{High}$ is the vector length for high level part vector quantization; the number 1 in numerator is the rate for sign bit (Group 1) (no compression assumed); the default number of bits to represent samples is assumed to be 15.

The performance of quantization may rely heavily on the choice of threshold θ. More precisely, a good choice of threshold should guarantee the lower levels contain low correlation, and minimize the number of higher levels at the same time to achieve low complexity for vector quantization. Accordingly, embodiments of the present disclosure recognize that a tradeoff between accuracy and complexity exists. For example, a lower choice of threshold may lead to better performance, as well as higher complexity for vector quantization (e.g., because larger codebook size is needed for quantizing a higher part to guarantee low distortion). Additionally, for example, the performance of MGQ may outperform original VQ when the threshold value is properly chosen.

Embodiments of the present disclosure also recognize that an important benefit of MGQ is complexity reduction. By performing block scaling and properly choosing threshold, the codebook size for vector quantization can be reduced. As a result, the storage space requirements for the codebook, codebook search time, as well as the codebook training time can be reduced using MGQ.

In order to construct the vector codebook to quantize OFDM samples, the first step is to construct vectors (vectorization) of OFDM samples. Since OFDM samples are complex-valued including I and Q components, embodiments of the present disclosure utilize multiple different methods for vectorizing OFDM samples depending on the placement of I and Q components of OFDM samples in the constructed vectors. The purpose of vectorization is to construct vectors that can capture the dependencies between OFDM samples.

In some embodiments, for vectorization of OFDM samples from a single antenna port, with N being the number of OFDM samples and L being the length of sample vectors that are constructed from the OFDM samples, the vectorization can be performed, for example, on a per OFDM symbol basis or per a group of OFDM symbols, e.g., N can be the number OFDM samples per OFDM symbol or per OFDM symbol group.

In some embodiments of the present disclosure, vector samples are constructed with a set of consecutive I components of OFDM samples only in time, or a set of consecutive Q components of OFDM samples only in time, e.g., vector samples are not formed with mixed I and Q components of OFDM samples. In an example vectorization procedure according to this embodiment, the compression modules 303 and 313 first obtain a composite sequence of OFDM samples including two sequences: the I sequence includes the I components, and the Q sequence includes the Q components, both in time order 1, 2, . . . , N. Starting from the first sample of the I sequence, vectors of consecutive L samples are constructed sequentially. At the end of the I sequence, if there are not enough samples left to form the last vector, then compression modules 303 and 313 cycle back to the beginning of the I sequence and finish constructing the last vector. The vectorization of samples in the Q sequence is similarly performed.

TABLE 6, below, illustrates an example vectorization according to this embodiment. As illustrated, given a set of complex OFDM samples, a composite sequence including I and Q sequences is obtained: I sequence includes the I components, and Q sequence includes the Q components. From these I and Q sequences, vectors are constructed by considering L consecutive components. For the last vector, cycling to the beginning of the respective sequence is performed, if necessary.

TABLE 6 an illustration of vectorization in which vectors
include either I or Q components of OFDM samples.

Complex OFDM samples:
$a_1 + j\ b_1$ , $a_2 + j\ b_2$ , . . . , $a_{N-1} + j\ b_{N-1}$ , $a_N + j\ b_N$
Composite sequence:
I sequence: $a_1$ , $a_2$ , $a_3$ , $a_4$ , . . . , $a_{N-1}$ , $a_N$
Q sequence: $b_1$ , $b_2$ , $b_3$ , $b_4$ , . . . , $b_{N-1}$ , $b_N$
Vectorization:
L = 2
$(a_1, a_2)$, $(a_3, a_4)$, $(a_5, a_6)$, . . .
$(b_1, b_2)$, $(b_3, b_4)$, $(b_5, b_6)$, . . .
Last vector:   $(a_{N-1}, a_N)$ or $(a_N, a_1)$
            $(b_{N-1}, b_N)$ or $(b_N, b_1)$
L = 3
$(a_1, a_2, a_3)$, $(a_4, a_5, a_6)$, . . .
$(b_1, b_2, b_3)$, $(b_4, b_5, b_6)$, . . .
Last vector:   $(a_{N-2}, a_{N-1}, a_N)$ or $(a_{N-1}, a_N, a_1)$ or $(a_N, a_1, a_2)$
            $(b_{N-2}, b_{N-1}, b_N)$ or $(b_{N-1}, b_N, b_1)$ or $(b_N, b_1, b_2)$
L = 4
.
.
.

In some embodiments of the present disclosure, compression modules 303 and 313 construct vector samples with a set of consecutive I and Q components of OFDM samples only in time, such that I and Q components of each OFDM sample are placed next to each other either in the same vector or in two adjacent vectors. In an example vectorization procedure according to this embodiment, compression modules 303 and 313 obtain a composite sequence of I and Q components of all OFDM samples in such a manner that I and Q components of each OFDM sample are placed next to each other and all (I, Q) component pairs are in time order 1, 2, . . . , N. Starting from the first sample of the composite sequence, vectors of consecutive L samples are constructed sequentially. At the end of the composite sequence, if there are not enough samples left to form the last vector, then compression modules 303 and 313 cycle back to the beginning of the sequence and finish constructing the last vector.

TABLE 7, below, illustrates an example vectorization according to this embodiment. As illustrated, given a set of complex OFDM samples, compression modules 303 and 313 first obtain a composite sequence including I and Q components of each OFDM sample placed next to each other. From this composite sequence, vectors are constructed by considering L consecutive components. For the last vector, compression modules 303 and 313 cycle back to the beginning of the composite sequence, if necessary.

TABLE 7 an illustration of vectorization in which vectors
include both I and Q components of OFDM samples.

Complex OFDM samples:
$a_1 + j\ b_1$ , $a_2 + j\ b_2$ , . . . , $a_{N-1} + j\ b_{N-1}$ , $a_N + j\ b_N$
Composite sequence:
$a_1$ , $b_1$ , $a_2$ , $b_2$ , $a_3$ , $b_3$, . . . , $a_{N-1}$, $b_{N-1}$ , $a_N$, $b_N$
Vectorization:
L = 2
$(a_1, b_1)$, $(a_2, b_2)$, $(a_3, b_3)$, . . .
Last vector: $(a_N, b_N)$
L = 3
$(a_1, b_1, a_2)$, $(b_2, a_3, b_3)$, . . .
Last vector: $(b_{N-1}, a_N, b_N)$ or $(a_N, b_N, a_1)$ or $(b_N, a_1, b_1)$
L = 4
.
.
.

In some embodiments of the present disclosure, vector samples are constructed with a set of I and Q components of OFDM samples obtained according to a given permutation or ordering of I and Q components of all OFDM samples.

In an example vectorization procedure according to this embodiment, compression modules 303 and 313 first obtain a permuted composite sequence of I and Q components of all OFDM samples according to a given permutation or ordering of I and Q components of all OFDM samples. Starting from the first component of the permuted composite sequence, vectors of consecutive L components are constructed sequentially. At the end of the permuted composite sequence, if there are not enough samples left to form the last vector, then compression modules 303 and 313 cycle back to the beginning of the sequence and finish constructing the last vector.

TABLE 8, below, illustrates an example vectorization according to this embodiment. As illustrated, given a set of complex OFDM samples, compression modules 303 and 313 first obtain a permuted composite sequence including I and Q components of all OFDM samples according to given permutation σ. From this permuted composite sequence, vectors are constructed by considering L consecutive components. For the last vector, compression modules 303 and 313 cycle back to the beginning of the permuted composite sequence, if necessary.

TABLE 8 an illustration of vectorization in which vectors include
permuted I and Q components of OFDM samples.

Complex OFDM samples:
$a_1 + j\ b_1$, $a_2 + j\ b_2$, ..., $a_{N-1} + j\ b_{N-1}$, $a_N + j\ b_N$
Permuted composite sequence:
$\sigma(a_1)$, $\sigma(b_1)$, $\sigma(a_2)$, $\sigma(b_2)$, $\sigma(a_3)$, $\sigma(b_3)$, ..., $\sigma(a_{N-1})$, $\sigma(b_{N-1})$, $\sigma(a_N)$, $\sigma(b_N)$
Vectorization:
L = 2
[$\sigma(a_1)$, $\sigma(b_1)$], [$\sigma(a_2)$, $\sigma(b_2)$], [$\sigma(a_3)$, $\sigma(b_3)$], ...
Last vector: [$\sigma(a_N)$, $\sigma(b_N)$]
L = 3
[$\sigma(a_1)$, $\sigma(b_1)$, $\sigma(a_2)$], [$\sigma(b_2)$, $\sigma(a_3)$, $\sigma(b_3)$], ...
Last vector: [$\sigma(b_{N-1})$, $\sigma(a_N)$, $\sigma(b_N)$] or [$\sigma(a_N)$, $\sigma(b_N)$, $\sigma(a_1)$] or [$\sigma(b_N)$, $\sigma(a_1)$, $\sigma(b_1)$]
L = 4
.
.
.

TABLE 9 an illustration of separate vectorization for each antenna port in
which vectors include either I or Q components of OFDM samples.

Complex OFDM samples:
Port 1: $a_1 + j\ b_1$, $a_2 + j\ b_2$, ..., $a_{N-1} + j\ b_{N-1}$, $a_N + j\ b_N$
Port 2: $c_1 + j\ d_1$, $c_2 + j\ d_2$, ..., $c_{N-1} + j\ d_{N-1}$, $c_N + j\ d_N$
Composite sequences:
Port 1: I sequence: $a_1$, $a_2$, $a_3$, $a_4$, ..., $a_{N-1}$, $a_N$
        Q sequence: $b_1$, $b_2$, $b_3$, $b_4$, ..., $b_{N-1}$, $b_N$
Port 2: I sequence: $c_1$, $c_2$, $c_3$, $c_4$, ..., $c_{N-1}$, $c_N$
        Q sequence: $d_1$, $d_2$, $d_3$, $d_4$, ..., $d_{N-1}$, $d_N$
Vectorization:
L = 2
Port 1: ($a_1$, $a_2$), ($a_3$, $a_4$), ($a_5$, $a_6$), ...
        ($b_1$, $b_2$), ($b_3$, $b_4$), ($b_5$, $b_6$), ...
Last vector: ($a_{N-1}$, $a_N$) or ($a_N$, $a_1$)
             ($b_{N-1}$, $b_N$) or ($b_N$, $b_1$)
Port 2: ($c_1$, $c_2$), ($c_3$, $c_4$), ($c_5$, $c_6$), ...
        ($d_1$, $d_2$), ($d_3$, $d_4$), ($d_5$, $d_6$), ...
Last vector: ($c_{N-1}$, $c_N$) or ($c_N$, $c_1$)
             ($d_{N-1}$, $d_N$) or ($d_N$, $d_1$)
L = 3
Port 1: ($a_1$, $a_2$, $a_3$), ($a_4$, $a_5$, $a_6$), ...
        ($b_1$, $b_2$, $b_3$), ($b_4$, $b_5$, $b_6$), ...
Last vector: ($a_{N-2}$, $a_{N-1}$, $a_N$) or ($a_{N-1}$, $a_N$, $a_1$) or ($a_N$, $a_1$, $a_2$)
             ($b_{N-2}$, $b_{N-1}$, $b_N$) or ($b_{N-1}$, $b_N$, $b_1$) or ($b_N$, $b_1$, $b_2$)
Port 2: ($c_1$, $c_2$, $c_3$), ($c_4$, $c_5$, $c_6$), ...
        ($d_1$, $d_2$, $d_3$), ($d_4$, $d_5$, $d_6$), ...
Last vector: ($c_{N-2}$, $c_{N-1}$, $c_N$) or ($c_{N-1}$, $c_N$, $c_1$) or ($c_N$, $c_1$, $c_2$)
             ($d_{N-2}$, $d_{N-1}$, $d_N$) or ($d_{N-1}$, $d_N$, $d_1$) or ($d_N$, $d_1$, $d_2$)

Various embodiments may be applied to vectorization of OFDM samples from multiple antenna ports with P being the number of antenna ports and assuming that the number of OFDM samples from each port is N. The principles in the forthcoming embodiments are straightforwardly applicable to the cases in which the numbers of OFDM samples from different antenna ports are different.

Various embodiments provide separate vectorization for each port. In the following embodiments, the vectorization is performed for each antenna port separately. In some embodiments of the present disclosure, for each antenna port, vector samples are constructed with a set of consecutive I components of OFDM samples from the same antenna port only in time, or a set of consecutive Q components of OFDM samples from the same antenna port only in time, e.g., vector samples are not formed with mixed I and Q components of OFDM samples from any antenna ports.

In an example vectorization procedure according to this embodiment, compression modules 303 and 313 first obtain, for each antenna port, a composite sequence of OFDM samples including two sequences: the I sequence includes all I components, and the Q sequence includes all Q components, both in time order 1, 2, . . . , N. Starting from the first sample of the I sequence of each antenna port, vectors of consecutive L samples are constructed sequentially. At the end of the I sequence, if there are not enough samples left to form the last vector, then compression modules 303 and 313 cycle back to the beginning of the I sequence and finish constructing the last vector. The vectorization of samples in the Q sequence of each antenna port is similarly performed.

TABLE 9, below, illustrates an example separate vectorization for each antenna port according to this embodiment. As illustrated, given a set of complex OFDM samples for two ports (Port 1 and Port 2), compression modules 303 and 313 first obtain, for each antenna port, a composite sequence including I and Q sequences: I sequence includes all I components, and Q sequence includes all Q components, both from the same antenna port. From these I and Q sequences, vectors are constructed by considering L consecutive components. For the last vector, compression modules 303 and 313 cycle back to the beginning of the respective sequence, if necessary.

In some embodiments of the present disclosure, for each antenna port, vector samples are constructed with a set of consecutive I and Q components of OFDM samples from the same antenna port only in time, such that I and Q components of each OFDM sample are placed next to each other either in the same vector or in two adjacent vectors.

In an example vectorization procedure according to this embodiment, compression modules 303 and 313 first obtain, for each antenna port, a composite sequence of I and Q components of all OFDM samples in such a manner that I and Q components of each OFDM sample are placed next to each other and all (I, Q) component pairs are in time order 1, 2, . . . , N. Starting from the first sample of the composite sequence of each antenna port, vectors of consecutive L samples are constructed sequentially. At the end of the composite sequence of each antenna port, if there are not enough samples left to form the last vector, then compression modules 303 and 313 cycle back to the beginning of the sequence and finish constructing the last vector.

TABLE 10, below, illustrates an example separate vectorization for each antenna port according to this embodiment. As illustrated, given a set of complex OFDM samples for two ports (Port 1 and Port 2), compression modules 303 and 313 first obtain, for each port, a composite sequence including I and Q components of each OFDM sample placed next to each other. From these composite sequences, vectors are constructed by considering L consecutive components. For the last vector, compression modules 303 and 313 cycle back to the beginning of the composite sequence, if necessary.

TABLE 10 an illustration of separate vectorization for each antenna port
in which vectors include both I and Q components of OFDM samples.

Complex OFDM samples:
Port 1: $a_1 + j\ b_1$, $a_2 + j\ b_2$, ..., $a_{N-1} + j\ b_{N-1}$, $a_N + j\ b_N$
Port 2: $c_1 + j\ d_1$, $c_2 + j\ d_2$, ..., $c_{N-1} + j\ d_{N-1}$, $c_N + j\ d_N$ TABLE 10-continued an illustration of separate vectorization for each antenna port
in which vectors include both I and Q components of OFDM samples.

Composite sequences:
Port 1: $a_1$ , $b_1$ , $a_2$ , $b_2$ , $a_3$ , $b_3$ , . . . , $a_{N-1}$, $b_{N-1}$ , $a_N$, $b_N$
Port 2: $c_1$ , $d_1$ , $c_2$ , $d_2$ , $c_3$ , $d_3$, . . . , $c_{N-1}$, $d_{N-1}$ , $c_N$, $d_N$
Vectorization:
L = 2
Port 1: $(a_1, b_1)$, $(a_2, b_2)$, $(a_3, b_3)$, . . .
Last vector: $(a_N, b_N)$
Port 2: $(c_1, d_1)$, $(c_2, d_2)$, $(c_3, d_3)$, . . .
Last vector: $(c_N, d_N)$
L = 3
Port 1: $(a_1, b_1, a_2)$, $(b_2, a_3, b_3)$, . . .
Last vector: $(b_{N-1}, a_N, b_N)$ or $(a_N, b_N, a_1)$ or $(b_N, a_1, b_1)$
Port 2: $(c_1, d_1, c_2)$, $(d_2, c_3, d_3)$, . . .
Last vector: $(d_{N-1}, c_N, d_N)$ or $(c_N, d_N, c_1)$ or $(d_N, c_1, d_1)$ In some embodiments of the present disclosure, for each antenna port, vector samples are constructed with a set of I and Q components of OFDM samples obtained according to a given permutation or ordering of I and Q components of all OFDM samples from the same antenna port.

In an example vectorization procedure according to this embodiment, compression modules 303 and 313 first obtain, for each antenna port, a permuted composite sequence of I and Q components of all OFDM samples according to a given permutation or ordering of I and Q components of all OFDM samples. Starting from the first component of the permuted composite sequence of each antenna port, vectors of consecutive L components are constructed sequentially. At the end of the permuted composite sequence of each antenna port, if there are not enough samples left to form the last vector, then compression modules 303 and 313 cycle back to the beginning of the sequence and finish constructing the last vector.

TABLE 11, below, illustrates an example separate vectorization for each antenna port according to this embodiment. As illustrated, given a set of complex OFDM samples for two ports (Port 1 and Port 2), compression modules 303 and 313 first obtain, for each port, a permuted composite sequence including I and Q components of all OFDM samples according to given permutation ($\sigma_1$ or $\sigma_2$). From this permuted composite sequence, vectors are constructed by considering L consecutive components. For the last vector, compression modules 303 and 313 cycle back to the beginning of the permuted composite sequence, if necessary.

TABLE 11 an illustration of separate vectorization for each antenna port in
which vectors include permuted I and Q components of OFDM samples.

Complex OFDM samples:
Port 1: $a_1 + j\ b_1$ , $a_2 + j\ b_2$ , . . . , $a_{N-1} + j\ b_{N-1}$ , $a_N + j\ b_N$
Port 2: $c_1 + j\ d_1$ , $c_2 + j\ d_2$ , . . . , $c_{N-1} + j\ d_{N-1}$ , $c_N + j\ d_N$
Permuted composite sequences:
Port 1: $\sigma_1(a_1)$, $\sigma_1(b_1)$ , $\sigma_1(a_2)$ , $\sigma_1(b_2)$ , $\sigma_1(a_3)$ , $\sigma_1(b_3)$, . . . , $\sigma_1(a_{N-1})$, $\sigma_1(b_{N-1})$ , $\sigma_1(a_N)$
$\sigma_1(b_N)$
Port 2: $\sigma_2(c_1)$, $\sigma_2(d_1)$ , $\sigma_2(c_2)$ , $\sigma_2(d_2)$ , $\sigma_2(c_3)$ , $\sigma_2(d_3)$, . . . , $\sigma_2(c_{N-1})$, $\sigma_2(d_{N-1})$ , $\sigma_2(c_N)$
$\sigma_2(d_N)$
Vectorization:
L = 2
Port 1:$[\sigma_1(a_1), \sigma_1(b_1)]$, $[\sigma_1(a_2) , \sigma_1(b_2)]$, $[\sigma_1(a_3) , \sigma_1(b_3)]$, . . .
Last vector: $[\sigma_1(a_N), \sigma_1(b_N)]$
Port 2:$[\sigma_2(c_1), \sigma_2(d_1)]$, $[\sigma_2(c_2) , \sigma_2(d_2)]$, $[\sigma_2(c_3) , \sigma_2(d_3)]$, . . .
Last vector: $[\sigma_2(c_N), \sigma_2(d_N)]$
L = 3
Port 1:$[\sigma_1(a_1), \sigma_1(b_1), \sigma_1(a_2)]$, $[\sigma_1(b_2) , \sigma_1(a_3) , \sigma_1(b_3)]$, . . .

TABLE 11-continued an illustration of separate vectorization for each antenna port in
which vectors include permuted I and Q components of OFDM samples.

Last vector: $[\sigma_1(b_{N-1}), \sigma_1(a_N)\ \sigma_1(b_N)]$ or $[\sigma_1(a_N), \sigma_1(b_N), \sigma_1(a_1)]$ or $[\sigma_1(b_N), \sigma_1(a_1), \sigma_1(b_1)]$
Port 2:$[\sigma_2(c_1), \sigma_2(d_1), \sigma_2(c_2)]$, $[\sigma_2(d_2), \sigma_2(c_3) , \sigma_2(d_3)]$, . . .
Last vector: $[\sigma_2(d_{N-1}), \sigma_2(c_N)\ \sigma_2(d_N)]$ or $[\sigma_2(c_N), \sigma_2(d_N), \sigma_2(c_1)]$ or $[\sigma_2(d_N), \sigma_2(c_1), \sigma_2(d_1)]$ In some embodiments of the present disclosure, the permutation functions used to vectorize I and Q components of OFDM samples from different antenna ports may be the same, e.g., $\sigma_p = \sigma_q$ for all $p \neq q$ in $\{1, 2, \ldots, P\}$, or they may be different, i.e., $\sigma_p \neq \sigma_q$ for all $p \neq q$ in $\{1, 2, \ldots, P\}$.

Various embodiments provide joint vectorization across ports. In the following embodiments, the vectorization is performed across all antenna ports. In some embodiments of the present disclosure, vector samples are constructed with a set of consecutive I components of OFDM samples from all antenna ports first in space (consecutive in port) then in time, or a set of consecutive Q components of OFDM samples from all antenna ports first in space (consecutive in port) then in time, e.g., vector samples are not formed with mixed I and Q components of OFDM samples from any antenna ports; however, they are formed with mixed I or mixed Q components such that I or Q components that are consecutive in port are placed either in the same vector or in adjacent vectors.

In an example vectorization procedure according to this embodiment, compression modules 303 and 313 first obtain a composite sequence of OFDM samples from all antenna ports including two sequences: the I sequence includes I components of all OFDM samples from all antenna ports, and the Q sequence includes Q components all OFDM samples from all antenna ports, both in time order 1, 2, . . . , N. In addition, in the I sequence, I components of OFDM samples from different antenna ports are placed sequentially in order, i.e., I components of the first OFDM samples from all antenna ports are placed together in order (1, 2, . . . , P). They are followed by I components of the second OFDM samples from all antenna ports in the same order (1, 2, . . . , P). On continuing placing the rest of the I components from all antenna ports in the same order, the I sequence is obtained. The Q sequence is obtained similarly with the Q components of all OFDM samples from all antenna ports. Starting from the first sample of the I sequence, vectors of consecutive L samples are constructed sequentially. At the end of the I sequence, if there are not enough samples left to form the last vector, then compression modules 303 and 313 cycle back to the beginning of the I sequence and finish constructing the last vector. The vectorization of samples in the Q sequence of each antenna port is similarly performed.

TABLE 12, below, illustrates an example joint vectorization across antenna ports according to this embodiment. As illustrated, given a set of complex OFDM samples for two ports (Port 1 and Port 2), compression modules 303 and 313 first obtain a composite sequence including I and Q sequences: I sequence includes all I components of OFDM samples from all antenna ports, and Q sequence includes all Q components of OFDM samples from all antenna ports, both constructed as described above. From these I and Q sequences, vectors are constructed by considering L consecutive components. For the last vector, compression modules 303 and 313 cycle back to the beginning of the respective sequence, if necessary.

TABLE 12 an illustration of joint vectorization across antenna ports in which vectors include either I or Q components of OFDM samples from different antenna ports.

Complex OFDM samples:
Port 1: $a_1 + j\, b_1$, $a_2 + j\, b_2$, ..., $a_{N-1} + j\, b_{N-1}$, $a_N + j\, b_N$
Port 2: $c_1 + j\, d_1$, $c_2 + j\, d_2$, ..., $c_{N-1} + j\, d_{N-1}$, $c_N + j\, d_N$
Composite sequence:
I sequence: $a_1$, $c_1$, $a_2$, $c_2$, $a_3$, $c_3$, ..., $a_{N-1}$, $c_{N-1}$, $a_N$, $c_N$
Q sequence: $b_1$, $d_1$, $b_2$, $d_2$, $b_3$, $d_3$, ..., $b_{N-1}$, $d_{N-1}$, $b_N$, $d_N$
Vectorization:
L = 2
$(a_1, c_1)$, $(a_2, c_2)$, $(a_3, c_3)$, ...
$(b_1, d_1)$, $(b_2, d_2)$, $(b_3, d_3)$, ...
Last vector:  $(a_N, c_N)$ or $(c_N, a_1)$
 $(b_N, d_N)$ or $(d_N, b_1)$
L = 3
$(a_1, c_1, a_2)$, $(c_2, a_3, c_3)$, ...
$(b_1, d_1, b_2)$, $(d_2, b_3, d_3)$, ...
Last vector:  $(c_{N-1}, a_N, c_N)$ or $(a_N, c_N, a_1)$ or $(c_N, a_1, c_1)$
 $(d_{N-1}, b_N, d_N)$ or $(b_N, d_N, b_1)$ or $(d_N, b_1, d_1)$
L = 4
.
.
.

TABLE 13 an illustration of joint vectorization across antenna ports in which vectors include both I and Q components of OFDM samples.

Complex OFDM samples:
Port 1: $a_1 + j\, b_1$, $a_2 + j\, b_2$, ..., $a_{N-1} + j\, b_{N-1}$, $a_N + j\, b_N$
Port 2: $c_1 + j\, d_1$, $c_2 + j\, d_2$, ..., $c_{N-1} + j\, d_{N-1}$, $c_N + j\, d_N$
Composite sequence:
$a_1$, $b_1$, $c_1$, $d_1$, $a_2$, $b_2$, $c_2$, $d_2$, ..., $a_{N-1}$, $b_{N-1}$, $c_{N-1}$, $d_{N-1}$, $a_N$, $b_N$, $c_N$, $d_N$
Vectorization:
L = 2
$(a_1, b_1)$, $(c_1, d_1)$, $(a_2, b_2)$, $(c_2, d_2)$, ...
Last vector: $(c_N, d_N)$
L = 3
$(a_1, b_1, c_1)$, $(d_1, a_2, b_2)$, $(c_2, d_2, a_3)$, $(b_3, c_3, d_3)$, ...
Last vector: $(b_N, c_N, d_N)$ or $(c_N, d_N, a_1)$ or $(d_N, a_1, b_1)$
L = 4
.
.
.

In some embodiments of the present disclosure, vector samples are constructed with a set of consecutive I and Q components of OFDM samples from all antenna ports first in space (consecutive in port) then in time, such that I and Q components of each OFDM sample are always placed next to each other either in the same vector or in two adjacent vectors.

In an example vectorization procedure according to this embodiment, compression modules 303 and 313 first obtain a composite sequence of I and Q components of all OFDM samples from all antenna ports in such a manner that the I and Q components of each OFDM sample are placed next to each other and all (I, Q) component pairs from all antenna ports are placed in order 1, 2, ..., N. In addition, I and Q components of OFDM samples from different antenna ports are placed sequentially in order, i.e., I and Q components of the first OFDM samples from all antenna ports are placed together in order (1, 2, ..., P). They are followed by I and Q components of the second OFDM samples from all antenna ports in the same order (1, 2, ..., P). On continuing placing the rest of I and Q components from all antenna ports in the same order, the entire composite sequence is obtained. Starting from the first sample of the composite sequence, vectors of consecutive L samples are constructed sequentially. At the end of the composite sequence, if there are not enough samples left to form the last vector, then compression modules 303 and 313 cycle back to the beginning of the sequence and finish constructing the last vector.

TABLE 13, below, illustrates an example joint vectorization across antenna ports according to this embodiment. As illustrated, given a set of complex OFDM samples for two ports (Port 1 and Port 2), compression modules 303 and 313 first obtain a composite sequence including I and Q components of each OFDM sample placed next to each other and samples of both antenna ports are placed sequentially in order, first in port order and then in time order. From this composite sequence, vectors are constructed by considering L consecutive components. For the last vector, compression modules 303 and 313 cycle back to the beginning of the composite sequence, if necessary.

In some embodiments of the present disclosure, vector samples are constructed with a set of I and Q components of OFDM samples from all antenna ports obtained according to a given permutation or ordering of I and Q components of all OFDM samples from all antenna ports. In an example vectorization procedure according to this embodiment, compression modules 303 and 313 first obtain a permuted composite sequence of I and Q components of all OFDM samples from all antenna ports according to a given permutation or ordering of I and Q components of all OFDM samples from all antenna ports. Starting from the first component of the permuted composite sequence, vectors of consecutive L components are constructed sequentially. At the end of the permuted composite sequence, if there are not enough samples left to form the last vector, then compression modules 303 and 313 cycle back to the beginning of the sequence and finish constructing the last vector.

TABLE 14, below, illustrates an example joint vectorization across antenna ports according to this embodiment. As illustrated, given a set of complex OFDM samples for two ports (Port 1 and Port 2), compression modules 303 and 313 first obtain a permuted composite sequence including I and Q components of all OFDM samples from both antenna ports according to given permutation ($\sigma$). From this permuted composite sequence, vectors are constructed by considering L consecutive components. For the last vector, compression modules 303 and 313 cycle back to the beginning of the permuted composite sequence, if necessary.

TABLE 14 an illustration of joint vectorization across antenna ports in which vectors include permuted I and Q components of OFDM samples.

Complex OFDM samples:
Port 1: $a_1 + j\, b_1$, $a_2 + j\, b_2$, ..., $a_{N-1} + j\, b_{N-1}$, $a_N + j\, b_N$
Port 2: $c_1 + j\, d_1$, $c_2 + j\, d_2$, ..., $c_{N-1} + j\, d_{N-1}$, $c_N + j\, d_N$
Permuted composite sequence:
$\sigma(a_1)$, $\sigma(b_1)$, $\sigma(c_1)$, $\sigma(d_1)$, $\sigma(a_2)$, $\sigma(b_2)$, $\sigma(c_2)$, $\sigma(d_2)$, ..., $\sigma(a_{N-1})$, $\sigma(b_{N-1})$, $\sigma(c_{N-1})$, $\sigma(d_{N-1})$, $\sigma(a_N)$, $\sigma(b_N)$, $\sigma(c_N)$, $\sigma(d_N)$
Vectorization:
L = 2
$[\sigma(a_1), \sigma(b_1)]$, $[\sigma(c_1), \sigma(d_1)]$, $[\sigma(a_2), \sigma(b_2)]$, $[\sigma(c_2), \sigma(d_2)]$, ...
Last vector: $[\sigma(c_N), \sigma(d_N)]$
L = 3
$[\sigma(a_1), \sigma(b_1), \sigma(c_1)]$, $[\sigma(d_1), \sigma(a_2), \sigma(b_2)]$, $[\sigma(c_2), \sigma(d_2), \sigma(a_3)]$, $[\sigma(b_3), \sigma(c_3), \sigma(d_3)]$, ...

TABLE 14-continued an illustration of joint vectorization across antenna ports in which vectors include permuted I and Q components of OFDM samples.

Last vector: [σ($b_N$), σ($c_N$), σ($d_N$)] or [σ($c_N$), σ($d_N$), σ($a_1$)] or [σ($d_N$), σ($a_1$), σ($b_1$)]
L = 4
.
.
.

Various embodiments of the present disclosure provide precoder dependent or based vectorization and codebook construction. In the above-mentioned embodiments related to systems with multiple antenna ports, no assumptions have been made about the precoding of OFDM samples. In practice, however, OFDM samples are likely to be precoded. There are various different types of precoders that may be used in practice. For instance, in a subframe, the precoding may be wideband (same for all PRBs in the subframe) or sub-band (different for different PRBs in the subframe). In multiple subframes, the precoding may be fixed for all subframes, or it may change from subframe to subframe. If the information about the type of precoder used to precode OFDM samples is available, embodiments of the present disclosure may use information about the type of precoder used to construct precoder dependent vector quantization codebooks. In order to use such precoder dependent vector quantization codebooks, either for quantization or for reconstruction, the information about the precoder may need to be available.

In some embodiments of the present disclosure, the vectorization of precoded OFDM samples and the constructed vector quantization codebook according to some embodiments of the present disclosure can be precoder specific. In some embodiments of the present disclosure, the permutation or ordering used in vectorization of precoded OFDM samples and the constructed vector quantization codebook according to some embodiments of the present disclosure may be chosen based on the precoder used to precode OFDM samples.

In some embodiments of the present disclosure, if the precoding is wideband in a subframe, then the vectorization and construction vector codebooks are also wideband, i.e., they remain the same for all PRBs in that subframe. And if the precoding is sub-band, then the vectorization and construction vector codebook are also sub-band, i.e., the vectorization and construction vector codebook change in different physical resource blocks (PRBs) in that subframe.

In some embodiments of the present disclosure, if the precoding is fixed in multiple subframes, then the vectorization and construction vector codebook are also fixed in all those subframes. And the precoding it changes between subframes, then the vectorization and construction vector codebooks are changed between subframes. In some embodiments of the present disclosure, the information about the type of precoder is pre-configured, or the information about the type of precoder is indicated with the codeword index to the receiver.

Various embodiments of the present disclosure provide methods to choose size of each level for multi-level codebook. In a multi-level codebook, the number of bits per sample needed to represent all codewords of the top level J is $$\left\lceil \frac{\log K_J}{L} \right\rceil.$$

Denoting $$\left\lceil \frac{\log K_J}{L} \right\rceil$$

by B and given B bits per sample to distribute between J levels, depending on whether B is divisible by J or not, these bits may be distributed differently.

In some embodiments of the present disclosure, irrespective of whether B is divisible by J or not, the level j codebook is assigned $b_j$ bits per sample where $0 < b_j < B$ so that $\Sigma_{j=1}^{J} b_j = B$. In some embodiments of the present disclosure, if B is divisible by J, then $$\frac{B}{J}$$

bits per sample may be distributed equally to each level. In this case, the size of all partitions of all levels may be the same. In some embodiments of the present disclosure, if B is not divisible by J, then $$\left\lceil \frac{B}{J} \right\rceil$$

bits per sample may be distributed equally to all levels except one level which is assigned $$B - \left\lceil \frac{B}{J} \right\rceil (J-1)$$

bits per sample. The one level may be the top or the bottom level. In some embodiments of the present disclosure, if B is not divisible by J, then $$\left\lfloor \frac{B}{J} \right\rfloor$$

bits per sample may be distributed equally to all levels except one level which is assigned $$B - \left\lfloor \frac{B}{J} \right\rfloor (J-1)$$

bits per sample. The one level may be the top or the bottom level.

Figure 16:
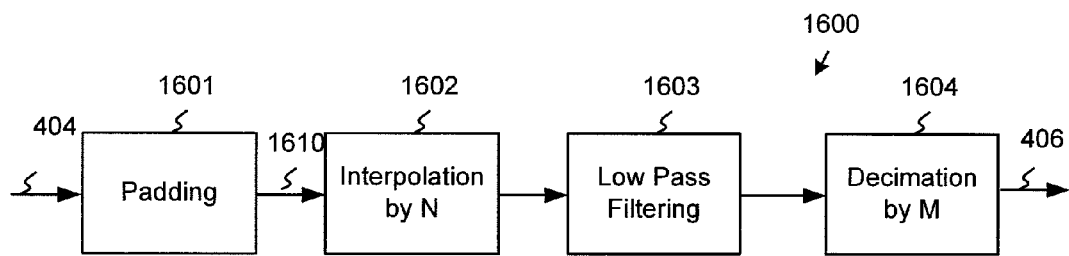
FIG. 16 illustrates a block diagram of a decimation signal processing chain according to various embodiments of the present disclosure.

FIG. 16 illustrates a block diagram of a decimation signal processing chain 1600 according to various embodiments of the present disclosure. The decimation signal processing chain 1600 is an example of one embodiment of the decimation block 405 in FIG. 4. The decimation block 405 converts signal 404 to a lower sampling rate by reducing guard band adjacent to the traffic signal's spectrum. In this embodiment, the interpolation factor N is less than the decimation factor M. As an example of the implementation, N=2 and M=3 are used to change the sampling rate to 2/3 of the input sampling rate.

The input signal 404 of the decimation signal processing chain 1600 is received from CP removal block 403. The padding block 1601 adds padding samples to the OFDM symbol. Interpolation block 1602 interpolates signal 1610 by N times with zero insertion. Low pass filtering block 1603 filters the interpolated signal to suppress the aliasing effect. Dissemination block 1604 decimates the filtered signal M times.

Since the CP has been removed in block 403, the cyclical shift property of the OFDM symbol does not hold. In order not to introduce inter-symbol interference (ISI), the decimation signal processing chain 1600 processes the incoming signal 404 at the OFDM symbol boundary. The padding block 1601 inserts proper padding samples to reduce the distortion at the OFDM symbol boundary.

Figure 17:
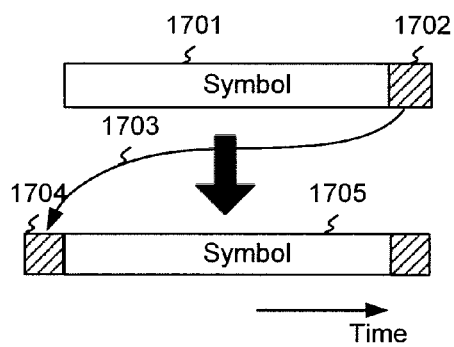
FIG. 17 illustrates an example of signal padding insertion according to various embodiments of the present disclosure.

FIG. 17 illustrates an example of signal padding insertion according to various embodiments of the present disclosure. An example of the padding insertion performed by padding block 1601 is illustrated in FIG. 17. The padding block 1601 copies and inserts (1703) a segment of the end portion 1702 of the OFDM symbol 1701 in front segment 1704 of the OFDM symbol 1705. The length of the segment can be, as an example, $$\left\lceil \frac{K}{2N} \right\rceil,$$

where K is the number of taps in the low pass filtering block 1603. The front segment 1704 may be the same, i.e., replica of end portion 1702, the segment 1704 may be an output of a windowing function of the end portion 1702. The windowing function can be, but is not limited to, Hamming, Blackman, etc. The combined samples of 1704 and 1705 (e.g., 1610 in FIG. 16) are fed to the rest of the decimation signal processing chain 1600 for processing.

Figure 18:
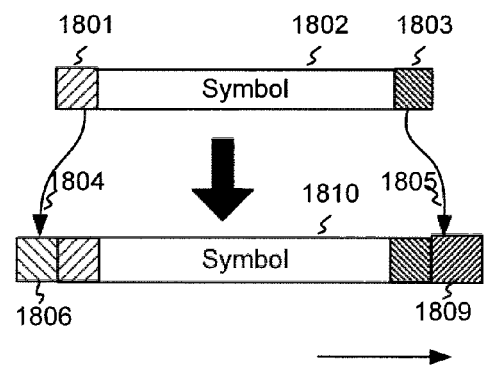
FIG. 18 illustrates another example of signal padding insertion according to various embodiments of the present disclosure.

FIG. 18 illustrates another example of signal padding insertion according to various embodiments of the present disclosure. Another example of the padding insertion performed by padding block 1601 is illustrated in FIG. 18. In this example, the padding block 1601 copies and inserts (1804) a segment 1801 of the beginning portion of the OFDM symbol 1802 in front segment 1806 of the OFDM symbol 1810. The length of the segment 1801 can be, as an example, $$\left\lceil \frac{K}{2N} \right\rceil,$$

where K is the number of taps in the low pass filtering block 1603. The front segment 1806 can be the mirror of the segment 1801, or it can be the output of a windowing function of the mirror of segment 1801. The windowing function can be, but is not limited to, Hamming, Blackman, etc. The padding block 1601 may perform a similar operation for the tail portion 1803 of the OFDM symbol 1802, e.g., 1809 is the mirror of, or the windowed mirror copy of tail portion 1803. The combined samples of 1806, 1810, and 1809 (e.g., 1610 in FIG. 16) are fed to the rest of the decimation signal processing chain 1600 for processing.

Figure 19:
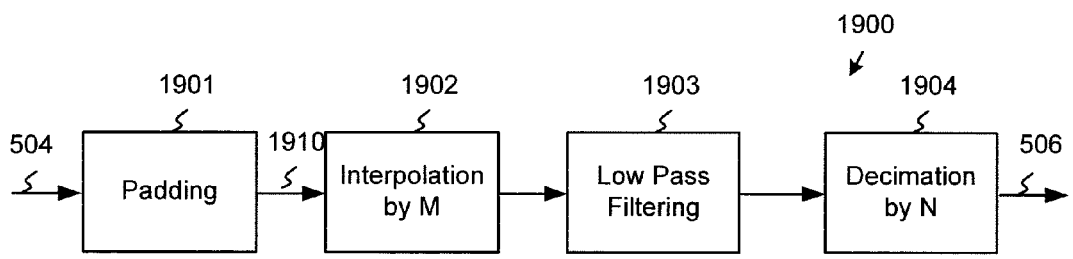
FIG. 19 illustrates a block diagram of an upsampling signal processing chain according to various embodiments of the present disclosure.

FIG. 19 illustrates a block diagram of an upsampling signal processing chain 1900 according to various embodiments of the present disclosure. For example, upsampling signal processing chain 1900 may be one embodiment of the upsampling block 505 in FIG. 5. The upsampling signal processing chain 1900 converts signal 504 to a higher sampling rate by increasing guard band adjacent to the traffic signal's spectrum. The output signal 506 has the original sampling at CP removal block (404) output. In this scheme, the interpolation factor M should match the decimation factor M in 1604. The decimation factor N should match the interpolation factor N in 1602. As an example of the implementation, N=2 and M=3 are used to change the sampling rate to 3/2 of the input sampling rate 504.

The input 504 of the upsampling signal processing chain 1900 comes from vector dequantizer block 503. A padding block 1901 receives input 504 and adds padding samples to the OFDM symbol. Interpolation block 1902 interpolates the output 1910 by M times with zero insertion. Low pass filtering block 1903 filters the interpolated signal to suppress the aliasing effect. Decimation block 1904 decimates the filtered signal N times. In order not to introduce inter-symbol interference (ISI), the upsampling signal processing chain 1900 processes the incoming signal 504 at OFDM symbol boundary. The padding block 1901 inserts proper padding samples to reduce the distortion at the OFDM symbol boundary.

The operations performed by the padding block 1901 may also be performed as discussed above with respect to FIGS. 17 and 18. The operation may be the same as discussed above, with the exception that the length of the padding segment can be, as an example, $$\left\lceil \frac{K}{2M} \right\rceil,$$

where K is the number of taps in the low pass filtering block 1903.

Although the present disclosure has been described with an exemplary embodiment, various changes and modifications may be suggested to one skilled in the art. It is intended that the present disclosure encompass such changes and modifications as fall within the scope of the appended claims.

None of the descriptions in this application should be read as implying that any particular element, step, or function is an essential element that must be included in the claim scope. The scope of patented subject matter is defined only by the claims. Moreover, none of the claims are intended to invoke 35 U.S.C. §112(f) unless the exact words "means for" are followed by a participle.

What is claimed is:

1. An apparatus for fronthaul signal compression, the apparatus comprising:
   a receiver configured to receive one or more signals comprising complex samples, the complex samples including real and imaginary parts;
   signal processing circuitry configured to:
   construct vectors representing at least a portion of the complex samples according to a vectorization or grouping method that separates the real and imaginary parts of the complex samples;
   map the vectors to codeword indices in a vector quantization codebook; and
   process the codeword indices into an output signal; and
   a fronthaul interface configured to transmit the output signal via a fronthaul communication link of a wireless network.

2. The apparatus of claim 1, wherein:
   the signal processing circuitry is configured to generate the vector quantization codebook based on training signals received by the receiver, and the fronthaul interface is configured to transmit information about the generated vector quantization codebook via the fronthaul communication link.

3. The apparatus of claim 2, wherein the signal processing circuitry is configured to generate a first vector quantization codebook based on a random initialization of the training signals and serially generate one or more additional vector quantization codebooks by resealing an output of a prior generated vector quantization codebook to generate a set of vector quantization codebooks; and select the vector quantization codebook from a set of vector quantization code books.

4. The apparatus of claim 1, wherein one of:
the signal processing circuitry is configured to select the vector quantization codebook from a set of vector quantization codebooks, and the fronthaul interface is configured to transmit information about the selection of the vector quantization codebook via the fronthaul communication link, and
the vector quantization codebook is pre-selected and the pre-selected vector quantization codebook is stored or hardcoded in a memory of the apparatus.

5. The apparatus of claim 1, wherein:
the signal processing circuitry is configured to select a vectorization method for constructing the vectors from a set of vectorization methods and to construct the vectors according to the selected vectorization method, and
the fronthaul interface is configured to transmit information about the selection of the vectorization method via the fronthaul communication link.

6. The apparatus of claim 1, wherein the signal processing circuitry is configured to identify a precoder used to precode the one or more signals and select the vector quantization codebook from a set of vector quantization codebooks based on the identified precoder.

7. The apparatus of claim 1, wherein the signal processing circuitry is configured to perform a binary expansion of the complex samples, group bits of the binary expanded samples into a plurality of groups, and perform no quantization of one or more of the groups, vector quantization of one or more of the groups, and scalar quantization of one or more of the groups, wherein a selection of a number of the groups for each type of quantization is based on a threshold.

8. The apparatus of claim 1, wherein:
the apparatus is included in a base band unit configured to receive the one or more signals from a backhaul or network interface, and
the signal processing circuitry is configured to perform compression on the one or more received signals for decompression by a remote radio head unit connected to the base band unit via the fronthaul communication link.

9. The apparatus of claim 1, wherein:
the apparatus is included in a remote radio head unit configured to receive the one or more signals from one or more user equipment in a wireless network, and
the signal processing circuitry is configured to perform compression on the one or more received signals for decompression by a base band unit connected to the remote radio head unit via the fronthaul communication link.

10. A method for fronthaul signal compression, the method comprising:
receiving one or more signals comprising complex samples, the complex samples including real and imaginary parts;
constructing vectors representing at least a portion of the complex samples according to a vectorization or grouping method that separates the real and imaginary parts of the complex samples;
mapping the vectors to codeword indices in a vector quantization codebook;
processing the codeword indices into an output signal; and
transmitting the output signal via a fronthaul communication link of a wireless network.

11. The method of claim 10, further comprising:
generating the vector quantization codebook based on training signals received by the receiver; and
transmitting information about the generated vector quantization codebook via the fronthaul communication link.

12. The method of claim 11, wherein generating the vector quantization codebook comprises:
generating a first vector quantization codebook based on a random initialization of the training signals;
serially generating one or more additional vector quantization codebooks by resealing an output of a prior generated vector quantization codebook to generate a set of vector quantization codebooks; and
selecting the vector quantization codebook from a set of vector quantization codebooks.

13. The method of claim 10, further comprising one of:
selecting the vector quantization codebook from a set of vector quantization codebooks and transmitting information about the selection of the vector quantization codebook via the fronthaul communication link, and
identifying the vector quantization codebook as a pre-selected vector quantization codebook stored or hardcoded in a memory.

14. The method of claim 10, wherein constructing the vectors comprises:
selecting a vectorization method for constructing the vectors from a set of vectorization methods;
constructing the vectors according to the selected vectorization method; and
transmitting information about the selection of the vectorization method via the fronthaul communication link.

15. The method of claim 10, further comprising:
identifying a precoder used to precode the one or more signals; and
selecting the vector quantization codebook from a set of vector quantization codebooks based on the identified precoder.

16. The method of claim 10, further comprising:
performing a binary expansion of the complex samples;
grouping bits of the binary expanded samples into a plurality of groups; and
performing no quantization of one or more of the groups, vector quantization of one or more of the groups, and scalar quantization of one or more of the groups,
wherein a selection of a number of groups for each type of quantization is based on a threshold.

17. An apparatus for fronthaul signal decompression, the apparatus comprising:
a fronthaul interface configured to receive an input signal via a fronthaul communication link of a wireless network; and
signal processing circuitry configured to:
process the input signal to identify codeword indices;
map the codeword indices to vectors in a vector quantization codebook; and devectorize the vectors into complex samples of an orthogonal frequency division multiplexing (OFDM) signal according to a devectorization method that recombines real and imaginary parts of the complex samples.

18. The apparatus of claim 17, wherein one of:

the fronthaul interface is configured to receive information about a selection of the vector quantization codebook from a set of vector quantization codebooks via the fronthaul communication link, and the vector quantization codebook is pre-selected and the pre-selected codebook is stored or hardcoded in a memory of the apparatus.

19. The apparatus of claim 17, wherein:

the apparatus is included in a base band unit configured to receive the input signal from a remote radio head unit via the fronthaul communication link, and the signal processing circuitry is configured to perform decompression on the received input signal compressed by the remote radio head unit.

20. The apparatus of claim 17, wherein:

the apparatus is included in a remote radio head unit configured to receive the input signal from a base band unit via the fronthaul communication link, and the signal processing circuitry is configured to perform decompression on the received input signal compressed by the base band unit.

\* \* \* \* \*